United States Patent
Ramamoorthy et al.

(10) Patent No.: US 11,888,067 B2
(45) Date of Patent: Jan. 30, 2024

(54) B-SITE DOPED PEROVSKITE LAYERS AND SEMICONDUCTOR DEVICE INCORPORATING SAME

(71) Applicant: Kepler Computing Inc., San Francisco, CA (US)

(72) Inventors: Ramesh Ramamoorthy, Moraga, CA (US); Sasikanth Manipatruni, Portland, OR (US); Gaurav Thareja, Santa Clara, CA (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 18/181,922

(22) Filed: Mar. 10, 2023

(65) Prior Publication Data
US 2023/0215953 A1 Jul. 6, 2023

Related U.S. Application Data

(60) Continuation of application No. 17/819,601, filed on Aug. 12, 2022, now Pat. No. 11,757,043, which is a (Continued)

(51) Int. Cl.
*H01L 21/00* (2006.01)
*H01L 29/786* (2006.01)
(Continued)

(52) U.S. Cl.
CPC ........ *H01L 29/78618* (2013.01); *H01L 28/56* (2013.01); *H01L 28/57* (2013.01); (Continued)

(58) Field of Classification Search
CPC ... H01L 29/78618; H01L 28/56; H01L 28/57; H01L 28/65; H10B 53/30; H10B 12/312; H10B 12/36
See application file for complete search history.

(56) References Cited

U.S. PATENT DOCUMENTS 5,155,658 A 10/1992 Inam et al.
5,168,420 A 12/1992 Ramesh
(Continued)

FOREIGN PATENT DOCUMENTS

EP 1209730 A2 5/2002
TW 201533888 9/2015
TW 201842651 12/2018

OTHER PUBLICATIONS

Srinivas et al., "Structural and Magnetic Properties of Mn Doped BiFeO3 Nanomaterials", Physics Research International, 2016.*
(Continued)

*Primary Examiner* — Richard A Booth
(74) *Attorney, Agent, or Firm* — Knobbe, Martens, Olson & Bear, LLP

(57) ABSTRACT

The disclosed technology generally relates to ferroelectric materials and semiconductor devices, and more particularly to semiconductor memory devices incorporating doped polar materials. In one aspect, a semiconductor device comprises a capacitor which in turn comprises a polar layer comprising a base polar material doped with a dopant. The base polar material includes one or more metal elements and one or both of oxygen or nitrogen. The dopant comprises a metal element that is different from the one or more metal elements and is present at a concentration such that a ferroelectric switching voltage of the capacitor is different from that of the capacitor having the base polar material without being doped with the dopant by more than about 100 mV. The capacitor stack additionally comprises first and second crystalline conductive oxide electrodes on opposing sides of the polar layer. The capacitor stack further comprises first and second barrier metal layers on respective ones of the first and second crystalline conductive oxide electrodes on opposing sides of the polar layer.

30 Claims, 14 Drawing Sheets

Related U.S. Application Data division of application No. 17/528,054, filed on Nov. 16, 2021, now Pat. No. 11,417,768, which is a continuation of application No. 17/305,301, filed on Jul. 2, 2021, now Pat. No. 11,349,031, which is a continuation of application No. 16/842,593, filed on Apr. 7, 2020, now Pat. No. 11,164,976.

(60) Provisional application No. 62/831,044, filed on Apr. 8, 2019.

(51) Int. Cl.
| | |
|---|---|
| H01L 29/66 | (2006.01) |
| H01L 29/20 | (2006.01) |
| H01L 29/74 | (2006.01) |
| H01L 29/737 | (2006.01) |
| H01L 49/02 | (2006.01) |
| H10B 53/30 | (2023.01) |
| H10B 12/00 | (2023.01) |

(52) U.S. Cl.
CPC ............. *H01L 28/60* (2013.01); *H01L 28/65* (2013.01); *H01L 29/2003* (2013.01); *H01L 29/6684* (2013.01); *H01L 29/7375* (2013.01); *H01L 29/7408* (2013.01); *H01L 29/7869* (2013.01); *H10B 53/30* (2023.02); *H10B 12/312* (2023.02); *H10B 12/36* (2023.02)

(56) References Cited

U.S. PATENT DOCUMENTS

| | | | |
|---|---|---|---|
| 5,169,485 A | 12/1992 | Allen, Jr. et al. | |
| 5,248,564 A | 9/1993 | Ramesh | |
| 5,270,298 A | 12/1993 | Ramesh | |
| 5,324,714 A | 6/1994 | Inam et al. | |
| 5,358,927 A | 10/1994 | Inam et al. | |
| 5,479,317 A | 12/1995 | Ramesh | |
| 5,519,235 A | 5/1996 | Ramesh | |
| 5,549,977 A | 8/1996 | Jin et al. | |
| 5,625,529 A | 4/1997 | Lee et al. | |
| 5,777,356 A | 7/1998 | Dhote et al. | |
| 5,798,903 A | 8/1998 | Dhote et al. | |
| 5,838,035 A | 11/1998 | Ramesh | |
| 5,955,754 A | 9/1999 | Azuma et al. | |
| 6,115,281 A | 9/2000 | Aggarwal et al. | |
| 6,194,754 B1* | 2/2001 | Aggarwal | H10B 53/00 257/295 |
| 6,265,230 B1 | 7/2001 | Aggarwal et al. | |
| 6,274,388 B1 | 8/2001 | Aggarwal et al. | |
| 6,307,228 B1 | 10/2001 | Miyazawa et al. | |
| 6,426,536 B1 | 7/2002 | Misewich et al. | |
| 6,482,538 B2 | 11/2002 | Ramesh et al. | |
| 6,518,609 B1* | 2/2003 | Ramesh | H01L 28/75 257/295 |
| 6,541,281 B2 | 4/2003 | Ramesh | |
| 6,610,549 B1 | 8/2003 | Aggarwal et al. | |
| 6,642,539 B2 | 11/2003 | Ramesh | |
| 6,781,176 B2 | 8/2004 | Ramesh | |
| 6,861,798 B1 | 3/2005 | Pan et al. | |
| 6,908,802 B2 | 6/2005 | Ramesh | |
| 7,029,925 B2 | 4/2006 | Celii et al. | |
| 7,071,007 B2 | 7/2006 | Tseng | |
| 7,095,067 B2 | 8/2006 | Hwang et al. | |
| 7,560,760 B2 | 7/2009 | Kim et al. | |
| 7,598,095 B2 | 10/2009 | Koo et al. | |
| 7,696,549 B2 | 4/2010 | Ramesh | |
| 8,106,375 B2 | 1/2012 | Chen et al. | |
| 8,216,858 B2 | 7/2012 | Takashima et al. | |
| 8,222,510 B2 | 7/2012 | Majumdar et al. | |
| 9,356,224 B2 | 5/2016 | Zeches et al. | |
| 10,403,631 B1 | 9/2019 | Lu et al. | |
| 10,475,801 B2 | 11/2019 | Lee | |
| 11,164,976 B2 | 11/2021 | Ramamoorthy et al. | |
| 11,289,607 B2 | 3/2022 | Ramamoorthy et al. | |
| 11,289,608 B2 | 3/2022 | Ramamoorthy et al. | |
| 11,296,228 B2 | 4/2022 | Ramamoorthy et al. | |
| 11,349,031 B2 | 5/2022 | Ramamoorthy et al. | |
| 11,355,643 B2 | 6/2022 | Ramamoorthy et al. | |
| 11,398,570 B2 | 7/2022 | Ramamoorthy et al. | |
| 11,411,116 B2 | 8/2022 | Ramamoorthy et al. | |
| 11,417,768 B2 | 8/2022 | Ramamoorthy et al. | |
| 11,444,203 B2 | 9/2022 | Ramamoorthy et al. | |
| 11,469,327 B2 | 10/2022 | Ramamoorthy et al. | |
| 11,757,043 B2 | 9/2023 | Ramamoorthy et al. | |
| 2002/0030246 A1 | 3/2002 | Eisenbeiser et al. | |
| 2002/0076906 A1 | 6/2002 | Hilt et al. | |
| 2003/0001189 A1 | 1/2003 | Fujiwara et al. | |
| 2005/0218756 A1 | 10/2005 | Fujii et al. | |
| 2005/0230726 A1 | 10/2005 | Li et al. | |
| 2007/0058415 A1 | 3/2007 | Im et al. | |
| 2007/0207587 A1 | 9/2007 | Kim et al. | |
| 2007/0252137 A1 | 11/2007 | Gelinck et al. | |
| 2009/0061538 A1 | 3/2009 | Heo et al. | |
| 2009/0238954 A1 | 9/2009 | Suh et al. | |
| 2009/0246543 A1 | 10/2009 | Noh et al. | |
| 2010/0320519 A1 | 12/2010 | Nagai | |
| 2011/0304423 A1 | 12/2011 | Wu et al. | |
| 2011/0308580 A1 | 12/2011 | Seidel et al. | |
| 2012/0213964 A1* | 8/2012 | Goyal | C30B 23/02 428/141 |
| 2013/0062733 A1 | 3/2013 | Summerfelt et al. | |
| 2014/0091845 A1 | 4/2014 | Then et al. | |
| 2015/0171183 A1 | 6/2015 | Sakai et al. | |
| 2015/0358151 A1 | 12/2015 | You et al. | |
| 2016/0118404 A1 | 4/2016 | Peng | |
| 2016/0308070 A1 | 10/2016 | Chang et al. | |
| 2016/0351577 A1 | 12/2016 | Sun | |
| 2018/0240803 A1 | 8/2018 | Yoo | |
| 2019/0043549 A1 | 2/2019 | Vaidyanathan et al. | |
| 2019/0096897 A1 | 3/2019 | Liao et al. | |
| 2019/0103151 A1 | 4/2019 | Nicholes et al. | |
| 2020/0273867 A1* | 8/2020 | Manipatruni | H01L 28/65 |
| 2020/0321474 A1 | 10/2020 | Ramamoorthy et al. | |
| 2023/0057354 A1 | 2/2023 | Ramamoorthy et al. | |
| 2023/0123515 A1 | 4/2023 | Ramamoorthy et al. | |
| 2023/0128526 A1 | 4/2023 | Ramamoorthy et al. | |
| 2023/0155028 A1 | 5/2023 | Ramamoorthy et al. | |
| 2023/0155029 A1 | 5/2023 | Ramamoorthy et al. | |
| 2023/0163216 A1 | 5/2023 | Ramamoorthy et al. | |
| 2023/0215952 A1 | 7/2023 | Ramamoorthy et al. | |
| 2023/0231055 A1 | 7/2023 | Ramamoorthy et al. | |

OTHER PUBLICATIONS

International Search Report and Written Opinion for PCT Application No. PCT/US2020/027103 dated Jun. 12, 2020 in 15 pages.
International Search Report and Written Opinion for PCT Application No. PCT/US2020/027108 dated Jun. 12, 2020 in 15 pages.
International Search Report and Written Opinion for PCT Application No. PCT/US2020/027100 dated Jun. 22, 2020 in 21 pages.
International Search Report and Written Opinion for PCT Application No. PCT/US2020/027111 dated Jul. 1, 2020 in 14 pages.
Office Action dated May 17, 2021 in U.S. Appl. No. 16/842,593.
Office Action dated May 25, 2021 in U.S. Appl. No. 16/842,535.
Office Action dated Jul. 1, 2021 in U.S. Appl. No. 16/842,596.
Office Action dated Jul. 7, 2021 in U.S. Appl. No. 16/842,593.
Office Action dated Jul. 26, 2021 in U.S. Appl. No. 17/304,730.
Office Action dated Nov. 10, 2021 in U.S. Appl. No. 16/842,571.
Office Action dated Dec. 6, 2021 in U.S. Appl. No. 17/305,305.
Office Action dated Dec. 27, 2021 in U.S. Appl. No. 16/842,535.
Basistyy, et al., Infrared-active optical phonons and magnetic excitations in the hexagonal manganites $RMnO_3$ (R=Ho, Er, Tm, Yb, and Lu), American Physical Society, Jul. 23, 2014, vol. 90, in 13 pages.
University of Illinois at Urbana-Champaign Ph.D. Thesis by David Michael Fanning, "Structure Property Relations in Ferroelectric Materials," Chapter 3, pp. 28-42, 2000.
Ghosez, et al., Chapter 134: First-Principles Modeling of Ferroelectric Oxides Nanostructures, Handbook of Theoretical and Computational Nanotechnology, American Scientific Publisher, in 153 pages.

(56) References Cited

OTHER PUBLICATIONS

Ghosh, et al., Theoretical Calculation of Absolute Radii of Atoms and Ions, Part 1. The Atomic Radii, International Journal of Molecular Sciences, Feb. 28, 2002, pp. 87-113, vol. 3, Multidisciplinary Digital Publishing Institute.

Nordlander, et al., The ultrathin limit of improper ferroelectricity, Nature Communications, https://doi.org/10.1038/s41467-019-13474-x | www.nature.com/naturecommunications, Dec. 6, 2019, 5591, vol. 10, pp. 1-7.

PBLittlewood, Physics of ferroelectrics, Jan. 27, 2002, pp. 1-26.

Setter, et al., Ferroelectric thin films: Review of materials, properties, and applications, Journal of Applied Physics 100, https://doi.org/10.1063/1.2336999, American Institute of Physics, Sep. 12, 2006, vol. 100, pp. 051606-1-051606-46.

Stewart, et al., Ferroelectric Hysteresis Measurement & Analysis, NPL Report CMMT (A) 152, May 1999, in 57 pages.

Ghahfarokhi et al., "The effect of Mn doped on the structural, magnetic, dielectric and optical properties of bismuth ferrite ($BiFe_{1-x}Mn_xO_3$) nanoparticles", Vacuum 173 (2020) 109143.

Sharma et al., "Electrical and Magnetic Properties of Mn-Doped $BiFeO_3$ Nanomaterials", Integrated Ferroelectrics 2019, vol. 203, pp. 81-90, https://doi.org/10.1080/10584587.2019.1674969.

Wani et al., "Optimizing phase formation of $BiFeO_3$ and Mn-doped $BiFeO_3$ nanoceramics via thermal treatment using citrate precursor method", SN Applied Sciences (2020) vol. 2, No. 1969, https://doi.org/10.1007/s42452-020-03669-z.

\* cited by examiner

FERRO-ELECTRICITY

DIPOLE MOMENT

ELECTRON CHARGE $E = 2PV_c \approx 1aJ$ $E_{SWITCH}(-\eta)$ $E_{SWITCH}(\eta)$

ORDER PARAMETER $\Theta$    ORDER PARAMETER $-\Theta$
RETENTION BARRIER $E(\Theta)$    RETENTION BARRIER $E(-\Theta)$ $$\lambda = \frac{E_{SW}}{E(\Theta)} \sim 2(FE), > 1000(STT)$$

B-SITE DOPED PEROVSKITE LAYERS AND SEMICONDUCTOR DEVICE INCORPORATING SAME

CROSS-REFERENCE TO RELATED APPLICATIONS

This application is a continuation of U.S. patent application Ser. No. 17/819,601, filed Aug. 12, 2022, which is a divisional of U.S. patent application Ser. No. 17/528,054, filed Nov. 16, 2021, which is a continuation of U.S. patent application Ser. No. 17/305,301, filed Jul. 2, 2021, which is a continuation of U.S. patent application Ser. No. 16/842,593, filed Apr. 7, 2020, which claims the benefit of priority to U.S. Provisional Patent Application No. 62/831,044, filed Apr. 8, 2019. The content of each of these applications is hereby incorporated by reference herein in its entirety.

BACKGROUND

Field

The disclosed technology generally relates to ferroelectric materials and semiconductor devices incorporating the same, and more particularly to semiconductor memory devices incorporating ferroelectric capacitors.

Description of the Related Art

Memory devices can be volatile or nonvolatile. Generally, volatile memory devices may have certain advantages, while nonvolatile memory device may have certain other advantages. For example, while some nonvolatile memory devices such as floating gate-based memory devices (e.g., flash memory device) may advantageously retain data without power, such devices may have relatively slow access times and limited cycling endurance. Conversely, while some volatile memory device such as dynamic random access memory (DRAM) may advantageously have relatively access times and higher cycling endurance, such devices lose data when powered off.

In some DRAM technologies, memory cells are arranged in a device architecture that includes a cell capacitor connected to the drain of an access transistor. In these technologies, memory states are stored in the cell capacitor. For example, stored charge in the cell capacitor may represent a logical state "1", while a lack of stored charge in the capacitor may represent a logical state "0". Writing may be accomplished by activating the access transistor, and draining the cell capacitor of its charge to write a "0", or charging the cell capacitor to write a "1". Reading may be accomplished in a similar manner by sensing the charge state of the cell capacitor using a sense amplifier to determine the memory state. If a pulse of charge is detected by the amplifier, the cell held a charge and thus reads "1", while a lack of such a pulse indicates a "0". In DRAM, the read process is destructive because if the capacitor was charge in the "1" state, it must be re-charged to restore the state. In addition, as the device footprint scales with advancing technology nodes, there is an increasing need to increase the dielectric constant while reducing the leakage current of the dielectric of the capacitor. Furthermore, even when powered, because the capacitor loses its charge after some time due to leakage, a DRAM cell is actively refreshed at intervals to restore the memory state. There is need for a memory device that provides an advantage over conventional volatile and nonvolatile memory technologies.

SUMMARY

In a first aspect, a semiconductor device comprises a capacitor comprising a polar layer comprising a base polar material doped with a dopant, wherein the base polar material includes one or more metal elements and one or both of oxygen or nitrogen, and wherein the dopant comprises a metal element that is different from the one or more metal elements and is present at a concentration such that a ferroelectric switching voltage of the capacitor is different from that of the capacitor having the base polar material without being doped with the dopant by more than about 100 mV. The capacitor stack additionally comprises first and second crystalline conductive oxide electrodes on opposing sides of the polar layer. The capacitor stack further comprises first and second barrier metal layers on respective ones of the first and second crystalline conductive oxide electrodes on opposing sides of the polar layer.

In a second aspect, a semiconductor device comprises a capacitor stack comprising a polar layer comprising a base polar material doped with a dopant, wherein the base polar material includes one or more metal elements and one or both of oxygen or nitrogen, and wherein the dopant comprises a metal element of one of 4d series, 5d series, 4f series or 5f series that is different from the one or more metal elements, wherein the dopant is present at a concentration such that a remnant polarization of the polar layer is different than that of the base polar material without the dopant. The capacitor stack further comprises first and second crystalline conductive oxide electrodes on opposing sides of the polar layer. The semiconductor device further comprises first and second barrier metal layers on respective ones of the first and second crystalline conductive oxide electrodes on opposing sides of the polar layer.

In a third aspect, a semiconductor device comprises a capacitor comprising a polar layer comprising a base polar material doped with a dopant, wherein the base polar material includes one or more metal elements and one or both of oxygen or nitrogen, wherein the dopant comprises a metal element that is different from the one or more metal elements and is present at a concentration such that a remnant polarization of the polar layer is different from that of the base polar material without the dopant by more than about 5 $\mu C/cm^2$. The capacitor stack additionally comprises first and second crystalline conductive oxide electrodes on opposing sides of the polar layer. The capacitor stack further comprises first and second barrier metal layers on respective ones of the first and second crystalline conductive oxide electrodes on opposing sides of the polar layer.

In a fourth aspect, a capacitor comprises a crystalline polar layer comprising a base polar material substitutionally doped with a dopant. The base polar material comprises one or more metal elements and one or both of oxygen or nitrogen. The dopant comprises a metal element of one of 4d series, 5d series, 4f series or 5f series that is different from the one or more metal elements, such that a ferroelectric switching voltage of the capacitor is different from that of the capacitor having the base polar material without being doped with the dopant by more than about 100 mV.

In a fifth aspect, a capacitor comprises a crystalline polar layer comprising a base polar material substitutionally doped with a dopant. The base polar material comprises a base metal oxide having a chemical formula $ABO_3$, wherein each of A and B represents on or more metal elements occupying interchangeable atomic positions of a crystal structure of the base polar material. The dopant comprising a metal element of one of 4d series, 5d series, 4f series or 5f series that is different from the one or more metal elements of the base polar material. The capacitor additionally comprises first and second crystalline conductive oxide electrodes on opposing sides of the polar layer. The crystalline polar layer has one of a perovskite structure, a hexagonal crystal structure or a superlattice structure.

In a sixth aspect, a capacitor comprises a crystalline polar layer comprising a base polar material substitutionally doped with a dopant. The base polar material comprises one or more metal elements and one or both of oxygen or nitrogen. The dopant comprises a metal element of one of 4d series, 5d series, 4f series or 5f series that is different from the one or more metal elements, wherein the dopant is present at a concentration such that a remnant polarization of the polar layer is different than that of the base polar material without the dopant by more than about 5 $\mu C/cm^2$.

In a seventh aspect, a semiconductor device comprises a capacitor, which in turn comprises a polar layer comprising a crystalline base polar material doped with a dopant. The base polar material includes one or more metal elements and one or both of oxygen or nitrogen, wherein the dopant comprises a metal element that is different from the one or more metal elements and is present at a concentration such that a ferroelectric switching voltage of the capacitor is different from that of the capacitor having the base polar material without being doped with the dopant by more than about 100 mV. The capacitor stack additionally comprises first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes. The first crystalline conductive or semiconductive oxide electrode serves as a template for growing the polar layer thereon, such that at least a portion of the polar layer is pseudomorphically formed on the first crystalline conductive or semiconductive oxide electrode.

In an eighth aspect, a semiconductor device comprises a capacitor, which in turn comprises a crystalline polar layer comprising a base polar material substitutionally doped with a dopant. The base polar material comprises a metal element having one of a perovskite structure or a hexagonal crystal structure. The dopant comprises a metal of one of 4d series, 5d series, 4f series or 5f series that is different from metal(s). The capacitor stack further comprises first and second crystalline conductive or semiconductive oxide electrodes on opposing sides of the crystalline polar layer, wherein the crystalline polar layer has the same crystal structure as one or both of the first and second crystalline conductive or semiconductive oxide electrodes.

In a ninth aspect, a semiconductor device comprises a capacitor, which in turn comprises a polar layer comprising a crystalline base polar material doped with a dopant, wherein the base polar material includes one or more metal elements and one or both of oxygen or nitrogen, wherein the dopant comprises a metal element that is different from the one or more metal elements and is present at a concentration such that a remnant polarization of the polar layer is different from that of the base polar material without the dopant by more than about 5 $\mu C/cm^2$, The capacitor stack additionally comprises first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes. The first crystalline conductive or semiconductive oxide electrode serves as a template for growing the polar layer thereon, such that at least a portion of the polar layer is pseudomorphically formed on the first crystalline conductive or semiconductive oxide electrode.

In a tenth aspect, a semiconductor device comprises a transistor formed on a silicon substrate and a capacitor electrically connected to the transistor by a conductive via. The capacitor comprises upper and lower conductive oxide electrodes on opposing sides of a polar layer, wherein the lower conductive oxide electrode is electrically connected to a drain of the transistor. The capacitor additionally comprises a polar layer comprising a base polar material doped with a dopant, wherein the base polar material includes one or more metal elements and one or both of oxygen or nitrogen, wherein the dopant comprises a metal element that is different from the one or more metal elements and is present at a concentration such that a ferroelectric switching voltage of the capacitor is different from that of the capacitor having the base polar material without being doped with the dopant by more than about 100 mV. The semiconductor device additionally comprises a lower barrier layer comprising a refractory metal or an intermetallic compound between the lower conductive oxide electrode and the conductive via.

In an eleventh aspect, a semiconductor device comprises a transistor formed on a silicon substrate and a capacitor electrically connected to the transistor by a conductive via. The capacitor comprises upper and lower conductive oxide electrodes on opposing sides of a polar layer, wherein the lower conductive oxide electrode is electrically connected to a drain of the transistor. The capacitor additionally comprises the polar layer comprising a base polar material doped with a dopant, wherein the base polar material includes one or more metal elements and one or both of oxygen or nitrogen, and wherein the dopant comprises a metal element of one of 4d series, 5d series, 4f series or 5f series that is different from metal(s) of the metal oxide that is present at a concentration such that a remnant polarization of the polar layer is different than that of the base polar material without the dopant. The semiconductor device additionally comprises a barrier sealant layer formed on one or both side surfaces of one or more of the polar layer, the upper conductive oxide electrode layer and the lower conductive oxide electrode layer.

In a twelfth aspect, a semiconductor device comprises a capacitor comprising a ferroelectric oxide layer interposed between first and second conductive oxide electrode layers, wherein the ferroelectric oxide layer comprises a base ferroelectric oxide that is doped with a dopant, wherein the dopant lowers a remnant polarization of the base ferroelectric oxide relative to an undoped base ferroelectric oxide by at least 5%.

In a thirteenth aspect, a semiconductor device comprises a ferroelectric oxide layer interposed between first and second conductive oxide electrode layers, wherein the ferroelectric oxide layer has a lattice constant that is matched within about 20% of a lattice constant of one or both of the first and second conductive oxide electrode layers.

In a fourteenth aspect, a semiconductor device comprises a capacitor comprising a ferroelectric oxide layer interposed between first and second conductive oxide electrode layers, wherein the ferroelectric oxide layer undergoes a ferroelectric transition at a voltage lower than about 600 mV across the capacitor.

In a fifteenth aspect, a semiconductor device comprises a capacitor comprising a ferroelectric oxide layer interposed between first and second conductive oxide electrode layers, wherein the ferroelectric oxide layer has a thickness less than about 50 nm.

In a sixteenth aspect, a semiconductor device comprises a ferroelectric oxide layer having a remnant polarization greater than about 10 $\mu C/cm^2$, wherein the ferroelectric oxide layer is doped with a lanthanide element at a concentration greater than about 5.0% on the basis of a total number of atomic sites of a metal of the ferroelectric oxide layer.

DETAILED DESCRIPTION

The demand for higher performance and lower price for semiconductor memories continue to grow for various applications, including high performance, high reliability and/or portable computing devices. For storage applications, due considerations including power-consumption, size and shock/vibration tolerance capability, solid state memory devices have been replacing hard disk drives for various applications.

The demand for memories with lower power, faster access speed and increasing memory capacity is reflected by the increasing demand for embedded memories. An embedded memory is integrated on-chip with other units such as microprocessors. Some embedded memories have a potential as a low power and high performance device because the memory is directly integrated to the logic circuits and analog components via on-chip bus, which can enable enhanced parallel processing. A further benefit of some embedded memories is the reduction of the number of chips enabled by higher level of integration, resulting in lower package cost and smaller number of pins per chip.

For nonvolatile memories including embedded nonvolatile memories, the desirable characteristics include low power operation, fast write/read times, a near infinite number of write/read cycles, compatibility with Si fabrication processes, non-volatility and lower added process cost for adding memory cells to logic circuitry.

The non-volatility is particularly helpful in reducing standby memory power. For some applications, e.g., high density standalone memory applications, smaller cell size is desirable to reduce cost. For some other applications, e.g., embedded memories, it may be more important to achieve desirable electrical properties than to realize a high density of the memory cells.

Conventional non-volatile memories such as flash memory or electrically erasable programmable read-only memory (EEPROM) only partially fulfil these demands. While they are nonvolatile, write/erase cycles are typically limited by about million cycles. In addition, write/erase times, voltage, energy and power consumption substantially exceed those of random access memories such as static random access memory (SRAM) and dynamic random access memory (DRAM).

Some embedded memories are based on SRAM. While added process cost is relatively small, SRAM is a volatile memory having a relatively large cell size and consumes relatively high standby power. Some other embedded memories are based on DRAM. While DRAM offers smaller cell size than SRAM, the added process cost is higher and it also consumes relatively high standby power.

Figure 1A:
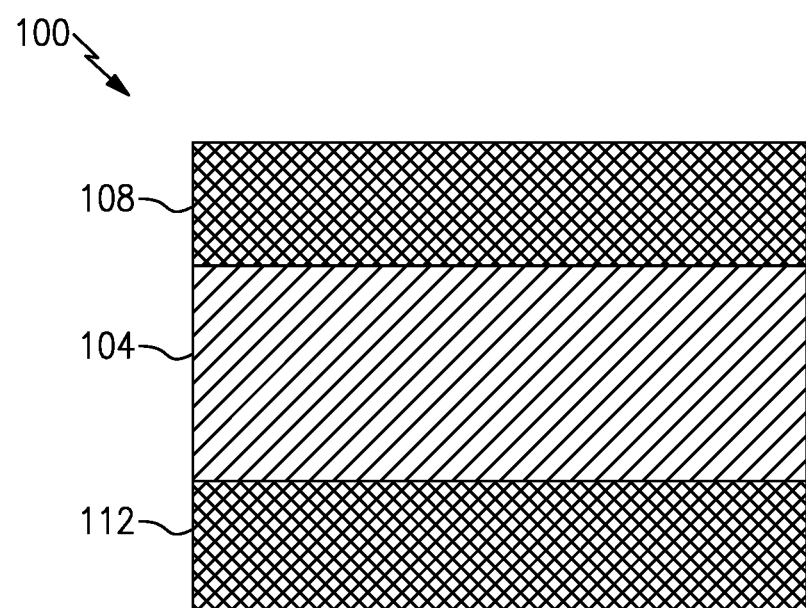
FIG. 1A schematically illustrates a side view of a capacitor comprising a polar layer interposed between first and second conductive oxide electrode layers, according to various embodiments.

Advantageous features of both volatile and nonvolatile memory technologies may be realized by employing a capacitor comprising a ferroelectric layer in a semiconductor memory device, e.g., a ferroelectric random access memory (FeRAM). FIG. 1A schematically illustrates a side view of a capacitor 100 comprising a storage layer 104, e.g., a ferroelectric layer, interposed between first and second conductive oxide electrode layers 108, 112, according to various embodiments. Unlike a DRAM cell capacitor in which a dielectric having a linear polarization-field (P-E) response may be used, the capacitor 100 includes a ferroelectric layer, which has a nonlinear P-E response. As described herein, a ferroelectric phenomenon refers to a phenomenon in which a crystal exhibits a spontaneous electric polarization in which the direction of the polarization can be reoriented between crystallographically defined states under an external electric field. When an external electric field is applied across the ferroelectric material, dipoles produced by small shifts in the positions of atoms or molecules shifts in the distributions of electronic charge in the crystal structure tend to align themselves with the field direction. After the charge is removed, the dipoles retain their polarization state, thereby exhibiting a remnant (sometimes referred to as remanent) polarization.

Figure 1B:
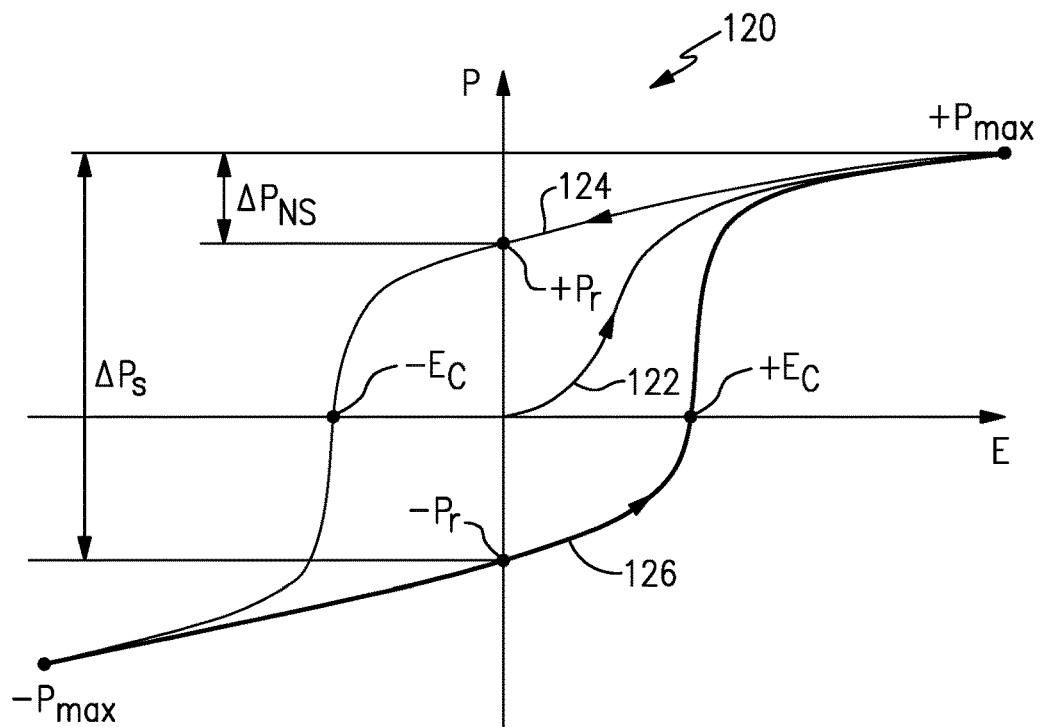
FIG. 1B schematically illustrates a polarization-field (P-E) loop of a ferroelectric capacitor comprising a ferroelectric layer, indicating polarization changes associated with non-switching and switching.

FIG. 1B schematically illustrates a polarization-field (P-E) loop 120 of a capacitor such as the capacitor 100 illustrated with respect to FIG. 1A comprising a storage layer 104, e.g., a ferroelectric layer. The P-E loop 120 may represent that of the ferroelectric layer comprising a polydomain ferroelectric material. In the illustrated P-E loop 120, prior to polarization for the first time, there may initially be a statistical distribution of ferroelectric domains such that the net polarization at zero field is about zero. The initial polarization (P) may be represented by a P-E curve portion 122. When the ferroelectric layer is polarized for the first time by applying a positive electric field, starting with a polarization P=0, the polarization increases with increasing field until it reaches saturation at +Pmax. After the saturation is reached at +Pmax, when the electric field is subsequently reduced according to a P-E curve portion 124, at E=0, a polarization may remain. The remaining polarization is referred to herein as a remnant polarization (+Pr). In order to bring the polarization back to zero, a negative electric field may be applied. A sufficient electric field for reducing the polarization back to zero is referred to herein as a coercive field (Ec). According to the P-E curve portion 124, a negative coercive field (-Ec) may be applied to reduce the polarization to zero from the +Pr. If the negative voltage or field is further increased in magnitude, then the hysteresis loop behaves similarly to that under a positive but in a reverse sense. That is, the negative P increases in magnitude with increasing negative electric field until it reaches saturation at -Pmax. Subsequently, when the electric field is subsequently reduced in magnitude along a P-E curve portion 126, at E=0, a remnant polarization -Pr may remain. Thus, the ferroelectric layer exhibits a characteristic of a remnant polarization +/-Pr, which can be reversed by an applied electric field in the reverse direction, which gives rise to a hysteretic P-E loop in ferroelectric capacitors.

By using thin film technologies, operation fields or voltages may be reduced to a level below standard chip supply voltages. FeRAM uses the P-E characteristic to hold data in a non-volatile state and allows data to be rewritten fast and frequently. Thus, a FeRAM has the advantageous features of both volatile and nonvolatile memory technologies.

Still referring to FIG. 1B, in various FeRAM devices, voltage pulses are used to write and read the digital information. If an electric field pulse is applied in the same direction as the remnant polarization, no switching may occur. A change in polarization $\Delta P_{NS}$ between Pmax and Pr may be present due to the dielectric response of the ferroelectric material. On the other hand, if an electric field pulse is applied in the opposite direction as the remnant polarization, switching may occur. For example, if the initial polarization is in the opposite direction as the applied electric field, the polarization of the ferroelectric layer reverses, giving rise to an increased switching polarization change $\Delta P_S$.

Figure 1C:
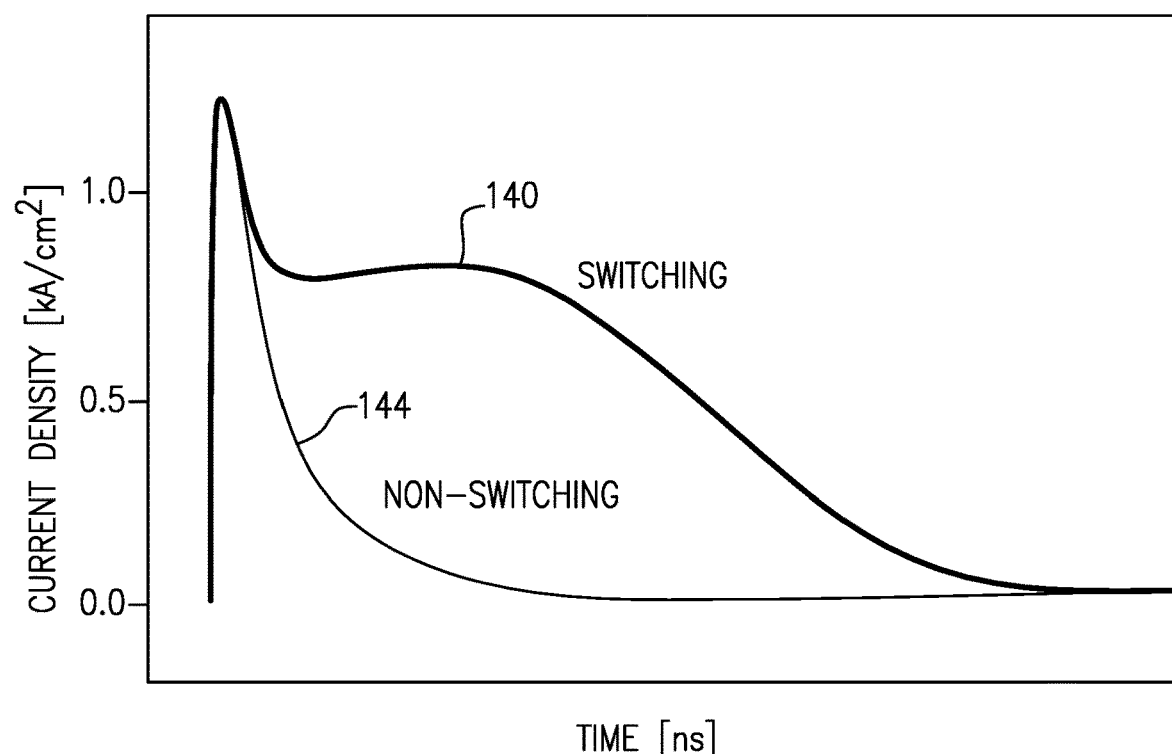
FIG. 1C schematically illustrates a temporal current response of a ferroelectric capacitor associated with non-switching and switching.

FIG. 1C schematically illustrates temporal current response curves 144 and 140 associated with non-switching and switching, respectively, of a ferroelectric capacitor such as the capacitor 100 including a ferroelectric layer as the storage layer 104 in FIG. 1A. The different states of the remnant polarization (+Pr and -Pr) illustrated above with respect to FIG. 1B can cause different transient current behavior of the ferroelectric capacitor to an applied voltage pulse. Based on a difference in current-time responses, e.g., instantaneous current, integrated current, rate of change in current, etc., the various parameters associated with switching between states corresponding to remnant polarizations +P and -P can be determined. For example, the switched charge $\Delta Q_S$ and the non-switch charge $\Delta Q_{NS}$ can be determined by integrating the current response curves 140 and 144, respectively. A difference in charge $\Delta Q = A\Delta P$ (where A is the area of capacitor) enables distinguishing of the two logic states.

Using the states having the remnant polarization (Pr and -Pr), FeRAM can be implemented as a nonvolatile memory, which is an advantage over a DRAM. The nonvolatility of the stored information can in turn reduce the energy consumption, e.g., by reducing or eliminating refresh. FeRAM also offers advantages over some nonvolatile memory technologies such as flash memory. For example, FeRAM can offer much higher cycling endurance compared to flash memory, by several orders of magnitude. FeRAM can also offer faster write times (few to tens of nanoseconds) compared to flash memory by several orders of magnitude. FeRAM can also offer write and read voltages that are fractions of those of flash memory.

For enhanced reliability as a nonvolatile memory, the remnant polarization of the ferroelectric layer should be suitably high because it is proportional to the switching charge. For example, for sub 100 nm nodes, when the switching charge of a ferroelectric capacitor, which may be expressed as $\Delta Q = A\Delta P$, where A is the area of the capacitor and $\Delta P$ is the switching polarization, falls below a threshold value of about 30 fC, 25 fC, 20 fC, 15 fC, 10 fC, 5 fC, or a value in a range between any of these values, a read failure may result. For nonvolatile memory devices in sub 100 nm nodes according to various embodiments, a switching polarization $\Delta P$ corresponding to a switching charge may be about 20-60 $\mu C/cm^2$, 60-100 $\mu C/cm^2$, 50-140 $\mu C/cm^2$, 140-180 $\mu C/cm^2$, 180-220 $\mu C/cm^2$, 220-260 $\mu C/cm^2$, or a value in a range between any of these values, corresponding to remnant polarization Pr>10 $\mu C/cm^2$, e.g., 10-30 $\mu C/cm^2$, 30-50 $\mu C/cm^2$, 50-70 $\mu C/cm^2$, 70-90 $\mu C/cm^2$, 90-110 $\mu C/cm^2$, 110-130 $\mu C/cm^2$, or a value in a range between any of these values.

For low power nonvolatile memory devices according to embodiments, a low coercive voltage is advantageous for low power and/or energy switching of the ferroelectric capacitor. For example, for various low power systems, e.g., systems having integrated therein FeRAM as an embedded memory, the coercive voltage (Ec) may be about 1200 mV, 1100 mV, 1000 mV, 900 mV, 800 mV, 700 mV, 600 mV, 500 mV, 400 mV, 300 mV, 200 mV, or a value in a range between any of these values.

Despite these advantages, for the small cell sizes in advanced technology nodes (e.g., sub 100 nm nodes), achieving relatively high remnant polarization (e.g., 10 $\mu C/cm^2$ for sufficient ON/OFF ratio, read window and nonvolatility) and relatively low coercive voltage (e.g., lower than about 1200 mV) for ultra-low voltage operation (e.g., lower than about 1200 mV) and nonvolatility (e.g., sufficient read window after 10 years at room temperature) for some applications have been difficult. For example, while a lower coercive voltage may be achieved by reducing the film thickness for some materials to an extent, decreasing the film thickness below a certain thickness may increase the coercive field in many ferroelectric materials, thereby failing to lower the coercive voltage. Thus, for each individual case, the thickness scaling may not be sufficient. To address these and other needs, in the disclosed technology, a ferroelectric capacitor for memory applications is disclosed, which can switch at ultra-low voltages (e.g., <1200 mV) while simultaneously displaying relatively high remnant polarization (e.g., >10 $\mu C/cm^2$).

The inventors have discovered that, to achieve these and other desirable performance parameter for nonvolatile memory applications, e.g., an FeRAM, a combination of various capacitor elements has to be engineered in conjunction. In particular, referring to FIG. 1A, the capacitor 100 comprises a storage layer 104 interposed between an upper or first conductive oxide electrode layer 108 and a lower or second conductive oxide electrode layer 112. According to various embodiments, the storage layer 104 comprises an engineered polar layer. The polar layer is engineered by providing a base polar material and doping the base polar material with a dopant. The base polar material includes one or more metal elements and one or both of oxygen or nitrogen. In some embodiments, the dopant comprises a metal element that different from the one or more metal elements and is present at a concentration such that a ferroelectric switching voltage of the capacitor is different from that of the capacitor having the base polar material without being doped with the dopant by more than about 100 mV. In some other embodiments, the dopant comprises a metal element of one of 4d series, 5d series, 4f series or 5f series that is different from the one or more metal elements and is present at a concentration such that a remnant polarization of the polar layer is different than that of the base polar material without the dopant. In some embodiments, the dopant comprises a metal element that different from the one or more metal elements and is present at a concentration such that a remnant polarization of the polar layer is different than that of the base polar material without the dopant by more than about 5 $\mu C/cm^2$. The capacitor 100 stack additionally comprises first and second conductive oxide electrode layers 108, 112 that are engineered in conjunction with the storage layer 104, e.g., with respect to the crystal structure, composition, thickness and stacking with further electrodes thickness. In some embodiments, the capacitor 100 further comprises first and second barrier metal layers on respective ones of the first and second crystalline conductive oxide electrodes on opposing sides of the polar layer.

The base polar material may be a dielectric material, a paraelectric material or a ferroelectric material, as described herein.

As described herein, dielectrics refer to electrical insulators that substantially do not conduct electricity because they have no or very little free electrons to conduct electricity. A dielectric can be polarized by applying an electric field. Dielectrics can be classified into polar dielectrics and non-polar dielectrics.

As described herein, a polar insulator or a polar material refers to an electrically insulating material having unit cells or molecular units that have a permanent electric dipoles moment. In these materials, in the absence of an external electric field, the polar molecular units are randomly oriented. As the result, in the absence of an external field display substantially no net dipole moment. When an external electric field is applied, the dipoles can align themselves with the external electric field such that a net dipole moment is produced.

As described herein, a non-polar insulator or a non-polar material refers to an electrically insulating material having unit cells or molecular units that do not have a permanent electric dipole moment. In these materials, in the absence of an external electric field, the center of positive charge coincides with the center of negative charge in the unit cells such that the molecules have substantially no net dipole moment. When an electric field is applied, positive charge experiences a force in the direction of electric field and negative charge experiences a force in the direction opposite to the field, such that the unit cells include dipoles therein, referred to as induced dipoles.

As described herein, a material that undergoes a dielectric polarization, or a dielectric material, refers to an insulating material which, when polarized, the induced polarization varies substantially linearly proportional to the applied external electric field. That is, unlike the P-E curve described above with respect to FIG. 1B, a dielectric material exhibits a substantially linear P-E response. Thus, the electric permittivity, corresponding to the slope of the polarization curve, can be a constant as a function of the external electric field.

As described herein, a material that undergoes a paraelectric polarization, or a paraelectric material, refers to an insulating material which, when polarized, the induced polarization varies substantially nonlinearly with E. That is, the material exhibits a substantially nonlinear P-E curve. Thus, the electric permittivity, corresponding to the slope of the polarization curve, is not a constant as in a paraelectric material but varies as a function of the external electric field. However, unlike the P-E curve described above with respect to FIG. 1B, a paraelectric material does not exhibit a hysteresis.

As described herein, a material that undergoes a ferroelectric polarization, or a ferroelectric, refers to an insulating material which, when polarized, the induced polarization varies substantially nonlinearly with E. In addition to displaying a nonlinear P-E curve as in a paraelectric material, as described above with respect to FIG. 1B, a material that undergoes a ferroelectric polarization, or a ferroelectric material, refers to an insulating material which demonstrates a remnant nonzero polarization even when the E is zero. Thus, the material exhibits a substantially nonlinear P-E curve having a hysteresis, as described above with respect to FIG. 1G. A distinguishing feature of a ferroelectric material includes reversal in polarity of the remnant polarization by a suitably strong applied E in the opposite direction. Thus, the polarization is therefore dependent not only on the current electric field but also on its history, thereby displaying a hysteresis loop, as discussed above with respect to FIG. 1B.

Some ferroelectric materials demonstrate substantial ferroelectricity below a certain phase transition temperature, referred to as the Curie temperature ($T_C$), while demonstrating paraelectricity above this temperature. Above the $T_C$, the remnant polarization vanishes, and the ferroelectric material transforms into a paraelectric material. Many ferroelectrics lose their piezoelectric properties above $T_C$ completely, because their paraelectric phase has a centrosymmetric crystal structure. Accordingly, as described herein, unless described otherwise, a material described as having a remnant polarization, e.g., a ferroelectric material, refers to the material below the $T_C$.

Doped Polar Layers for Semiconductor Devices

To achieve the above performance parameters of a capacitor, according to various embodiments, a semiconductor device, e.g., a memory device, includes a capacitor, e.g., a capacitor 100 arranged as illustrated in FIG. 1A. The capacitor comprises a storage layer 104, which in turn comprises a crystalline polar layer comprising a base polar material that is doped, e.g., substitutionally doped, with a dopant. In some embodiments, the base polar material includes one or more metal elements and one or both of oxygen or nitrogen. The dopant comprises a metal element of one of 4d series, 5d series, 4f series or 5f series that is different from the one or more metal elements. The dopant is present at a concentration such that a remnant polarization of the polar layer is different than that of the base polar material without the dopant by more than about 5 $\mu C/cm^2$. In some other embodiments, the base polar material comprises a base metal oxide having a chemical formula $ABO_3$, wherein each of A and B represents on or more metal elements occupying interchangeable atomic positions of a crystal structure of the base polar material. The dopant comprising a metal element of one of 4d series, 5d series, 4f series or 5f series that is different from the one or more metal elements. The capacitor additionally comprises first and second crystalline conductive oxide electrodes on opposing sides of the polar layer. The crystalline polar layer has one of a perovskite structure, a hexagonal crystal structure or a superlattice structure. The capacitor stack additionally comprises first and second crystalline conductive oxide electrodes 108, 112, that is engineered in conjunction with the storage layer 104, e.g., with respect to the crystal structure and/or composition.

According to various embodiments, the base polar material comprises a base ferroelectric material, a base paraelectric material, a dielectric material, or a combination thereof. Doping the base polar material according to embodiments disclosed herein changes the ferroelectric characteristics of the base polar material.

In some embodiments, when the base polar material comprises a base ferroelectric material, increasing the concentration of the dopant decreases the remnant polarization of the base ferroelectric material. In these embodiments, the polar layer is a ferroelectric layer but has a remnant polarization that is lower than it would be without the presence of the dopant. For example, the concentration of the dopant the may be present at a concentration such that the polar layer is a paraelectric layer having substantially zero remnant polarization. However, embodiments are not so limited and in other embodiments, when the base polar material comprises a base ferroelectric material, increasing the concentration of the dopant increases the remnant polarization of the base ferroelectric material. In these embodiments, the polar layer is a ferroelectric layer but has a remnant polarization that is higher than it would be without the presence of the dopant.

In some embodiments, when the base polar material comprises a base paraelectric material or a base dielectric material, increasing the concentration of the dopant increases the remnant polarization of the base paraelectric material or the base dielectric material. In these embodiments, the dopant comprises an element and is present at a concentration such that the base paraelectric material or the base dielectric material is converted to a ferroelectric material, and the resulting polar layer is a ferroelectric layer. However, embodiments are not so limited and in other embodiments, when the base polar material comprises a base ferroelectric material, increasing the concentration of the dopant may not result in an increases the remnant polarization of the base ferroelectric material. In these embodiments, the dopant comprises an element and is present at a concentration such that the base paraelectric material or the base dielectric material is not converted to a ferroelectric material, such that the resulting polar layer is a paraelectric or dielectric layer.

From a device point of view, it can be important for the storage layer 104 to undergo substantially complete switching between stable states, e.g., between +Pr and −Pr states to obtain unambiguous digital information. The substantial complete switching may be achieved by sufficiently high field and sufficiently long pulse width. Switching time depends on many factors, e.g., domain structure, nucleation rate of energetically favorable ferroelectric domains, the mobility of the ferroelectric domain walls, to name a few. Without being bound to any theory, a lower limit for the switching time (to), assuming sufficient field greater than the coercive field is applied, can be related to the time for a ferroelectric domain wall to propagate from one electrode to another in a capacitor film with a thickness (d) by:

$t_0=d/c,$ where c is the velocity of the domain wall. The velocity of the domain wall can correspond to the speed of sound (~4000 m/s). For example, for a 200 nm thick polar layer, to can be about 50 ps. However, conventional ferroelectric stacks, e.g., using Pt electrodes, can display a thickness effect, where a reduction in the thickness d can reduce the switching time only to an extent, while a further reduction may not result in a reduction in the switching speed. Without being bound to any theory, such effect can be attributed to a variety of factors, including increasing effective coercive field with decreasing d, which can in turn be caused by an interfacial dielectric layer that forms between the polar layer and the electrode(s). Such interfacial layer can give rise to charge injection effects into the interfacial layers, leading to screening effects, which increases the effective coercive field. Thus, to enable fast (e.g., <20 ns) and low voltage (e.g., <1200 mV) switching of a ferroelectric capacitor according to various embodiments described herein, the inventors have optimized the thickness, the composition of the doped polar layer and the oxide electrodes (e.g., having a crystal structure matching the doped polar layer), as described herein.

To enable these and other advantages, in various embodiments disclosed, herein, the storage layer 104 (FIG. 1A) is a ferroelectric layer as doped and advantageously undergoes a ferroelectric transition at a voltage across the storage layer 104, which may correspond to the coercive voltage, that is lower than about 1200 mV, 1100 mV, 1000 mV, 900 mV, 800 mV, 700 mV, 600 mV, 500 mV, 400 mV, 300 mV, 200 mV, 100 mV, or a voltage in a range defined by any of these voltages. In some embodiments, these low voltages may be achieved while simultaneously displaying relatively high remnant polarization (e.g., >10 $\mu C/cm^2$). The combination of relatively low voltage ferroelectric transition and the relatively high remnant polarization is achieved through various combinations of features describe herein.

In various embodiments disclosed herein, the storage layer 104 (FIG. 1A) is a ferroelectric layer and is formed from a base ferroelectric material having a relatively high starting remnant polarization, e.g., >10 $\mu C/cm^2$, that is doped with a dopant, wherein the dopant lowers a remnant polarization of the base ferroelectric material relative to an undoped base ferroelectric material by at least 5%.

In various embodiments disclosed herein, the storage layer 104 (FIG. 1A), which may have a matched crystal structure to the polar layer, has a lattice constant that is matched within about 25%, 20%, 15%, 10%, 5%, 2%, 1%, or a percentage in a range defined by any of these values, of a lattice constant of one or both of the first and second conductive oxide electrode layers 108, 112. At least portions of the storage layer 104 and one or both of the first and second conductive oxide electrode layers 108, 112 may be pseudomorphic.

Accordingly, according to various embodiments disclosed herein, to enable fast and low voltage switching, the storage layer 104 has a thickness less than about 200 nm, 150 nm, 100 nm, 50 nm, 20 nm, 10 nm, 5 nm, 2 nm, or a thickness in a range defined by any of these values. In some implementations, these the thickness may be a critical parameter such that when the thickness is outside these values, the desired switching voltage and/or switching time may not be achieved.

In addition, in various embodiments disclosed herein, the storage layer 104 is doped with a dopant at a concentration greater than about 5.0% on the basis of a total number of metal atoms of the ferroelectric oxide layer. The doped storage layer 104 has a remnant polarization that is different from an the storage layer 104 having the same composition without the dopant by greater than about 5 $\mu C/cm^2$, and having a final remnant polarization that is greater than about 10 $\mu C/cm^2$.

As described above, the base polar material may be a dielectric material, a paraelectric material or a ferroelectric material, as described above. As described, in some embodiments, dopants may decrease the remnant polarization of a base polar material that is a ferroelectric material while reducing a double well potential of the free energy curve. In some other embodiments, dopants may introduce a remnant polarization by doping a base polar material that is a paraelectric material, which may be accompanied by a double well potential of the free energy curve. In yet some other embodiments, dopants may introduce a remnant polarization by doping a base polar material that is a dielectric material, which may be accompanied by a double well potential of the free energy curve. In these embodiments, the base polar material comprises a dielectric material, and the dopant increases the ferroelectricity of the dielectric material such that the polar layer has a remnant polarization greater than about 10 $\mu C/cm^2$. In some embodiments, the dielectric material comprises one or more of an oxide of Hf, Zr, Al, Si or a mixture thereof. In some embodiments, the dielectric material has a chemical formula represented by $Hf_{1-x}E_xO_y$, wherein each of x and y is greater than zero, and wherein E is selected from the group consisting of Al, Ca, Ce, Dy, Er, Gd, Ge, La, Sc, Si, Sr, Sn or Y. In some embodiments, the dielectric material has a chemical formula represented by $Al_{1-x}R_xN$, $Ga_{1-x}R_xN$ or $Al_{1-x-y}Mg_xNb_yN$, wherein each of x and y is greater than zero, and wherein R is selected from the group consisting of Al, Ca, Ce, Dy, Er, Gd, Ge, La, Sc, Si, Sr, Sn or Y.

Crystal Structures and Compositions of Polar Layers for Ferroelectric Capacitors According to various embodiments, the storage layer 104 (FIG. 1A) comprises a crystalline polar layer having a perovskite crystal lattice structure, a hexagonal crystal lattice structure, or a superlattice structure.

In some embodiments, the polar layer comprises a ferroelectric oxide having a chemical formula represented by $A_{(m-x)}A'_xB_{(n-y)}B'_yO_z$, wherein m, n and z are integers, and wherein one or both of x and y are greater than zero. A and A' are metals that occupy interchangeable atomic positions in the crystal structure and B and B' are metals that occupy interchangeable atomic positions in the crystal structure. One or both of the A' and B' may be dopants. Thus, in these embodiments, the ferroelectric oxide comprises a base polar material, which may be represented by a base chemical formula $A_mB_nO_z$, that is doped with one or more dopants A' and/or B' to have the chemical formula $A_{(m-x)}A'_xB_{(n-y)}B'_yO_z$.

In the chemical formula represented by $A_{(m-x)}A'_xB_{(n-y)}B'_yO_z$ above, A and B can represent more than one atom, such that the ferroelectric oxide is a doped solid solution. That is, in some embodiments, the ferroelectric oxide can be represented by a generalized formula for a solid solution represented by $(A_1, A_2, \ldots A_N)_{(m-x)}A'_x(B_1, B_2, \ldots B_M)_{(n-y)}B'_yO_z$, wherein m, n and z are integers, and wherein one or both of x and y are greater than zero. $A_1, A_2, \ldots A_N$ as well as A' occupy interchangeable atomic positions in the crystal structure and $B_1, B_2, \ldots B_M$ as well as B' occupy interchangeable atomic positions in the crystal structure. One or both of the A' and B' may be dopants, while $A_1, A_2, \ldots A_N$ and $B_1, B_2, \ldots B_M$ are alloying elements. Thus, in these embodiments, the ferroelectric oxide comprises a base polar material, which may be represented by a base chemical formula $(A_1A_2, \ldots A_N)_m(B_1, B_2, \ldots B_M)_nO_z$, that is doped with one or more dopants A' and/or B' to have the chemical formula $(A_1, A_2, \ldots A_N)_{(m-x)}A'_x(B_1, B_2, \ldots B_M)_{(n-y)}B'_yO_z$. In an analogous manner, in the chemical formula represented by $A_{(m-x)}A'_xB_{(n-y)}B'_yO_z$, A' and B' can represent more than one atom, such that the ferroelectric oxide is a doped with multiple dopants, e.g., $(A'_1, A'_2, \ldots A'_N)_x$ that occupy interchangeable atomic positions, and $(B'_1, B'_2, \ldots B'_M)_y$ that occupy interchangeable atomic positions, where each of $A'_1, A'_2, \ldots A'_N$ and $B'_1, B'_2, \ldots B'_M$ can represents a dopant. For simplicity of representation as described herein, some chemical compounds may be represented without one or more of the subscripts x, y, z, m, n, M and N, which compounds will be understood to have appropriate values of the subscripts to satisfy the charge neutrality and stoichiometry, among other things. For example, a doped alloy represented by $(A_1, A_2, \ldots A_N)_{(m-x)}(A'_1, A'_2, \ldots A'_N)_x(B_1, B_2, \ldots B_M)_{(n-y)}(B'_1, B'_2, \ldots B'_M)_yO_z$ may represented as $(A_1, A_2, \ldots A_N)(A'_1, A'_2, \ldots A'_N)(B_1, B_2, \ldots B_M)(B'_1, B'_2, \ldots B'_M)O$, without limitation.

While the dopant(s) A' and the alloying elements $A_1, A_2, \ldots A_N$, and the dopant(s) B' and the alloying elements $B_1, B_2, \ldots B_N$ may occupy respective interchangeable atomic positions in the crystal structures, the dopant(s) refer to substituted elements having particular attributes and technical effects, e.g., ferroelectric properties, on the resulting polar layer. In particular, as described herein, a dopant refers to an element that replaces an atom in the base material, e.g., substitutionally, where the dopant has an oxidation state that is different from the atom it replaces. In addition, the dopant is present in a concentration such that a remnant polarization of the polar layer is different than that of the base polar material without the dopant by more than about 5 $\mu C/cm^2$, where the effective concentration results in a remnant polarization of the doped polar layer being greater than about 5 $\mu C/cm^2$, among other ferroelectric properties. In various embodiments, the dopant may be a metal element of one of 4d series, 5d series, 4f series or 5f series. In some embodiments, the dopant comprises a lanthanide element or niobium. In addition, the dopants A' and/or B' and their concentrations are such that the metal atoms may achieve a spontaneous distortion of atomic position in the range of 0.3-2% on the basis of a lattice constant of a paraelectric phase of the base polar material. In various embodiments, the dopant having the above characteristics is present at an effective concentration greater than 0.1 percent and less than 25 percent on the basis of the total number of metal atoms in the polar layer, and wherein the polar layer undergoes a ferroelectric transition at a voltage lower than about 1200 mV. Additional details of engineering the crystal structure with dopant(s) to achieve these and other characteristics of the polar layer are discussed infra.

Figure 2A:
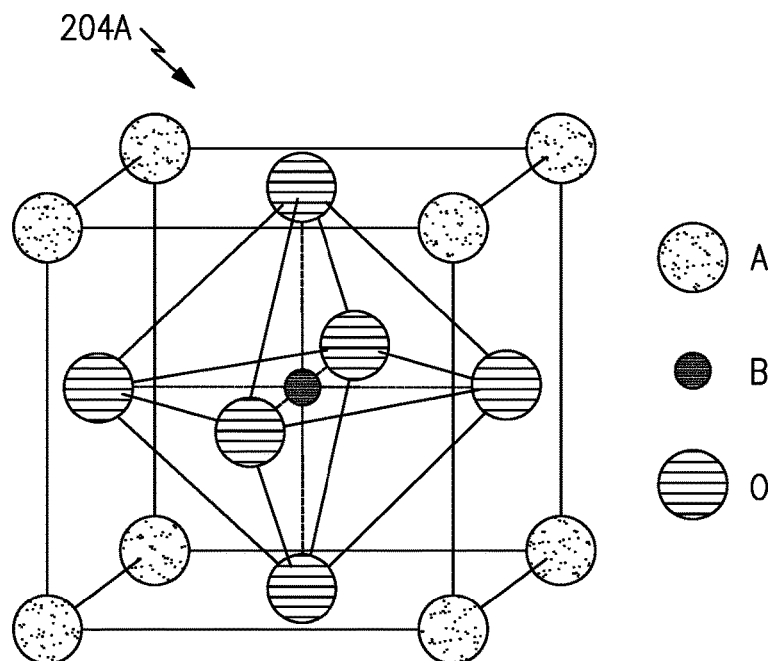
FIG. 2A schematically illustrates a perovskite crystal structure of a polar layer of a capacitor, according to some embodiments.

Referring to FIG. 2A, according to some embodiments, the crystalline polar layer has a perovskite structure 204A. The illustrated perovskite structure 204A represents a crystalline oxide in a paraelectric state, which may have a chemical formula $ABO_3$, where each of A and B represent one or more metal cations and O represents an oxygen anion. The crystalline polar layer can have more than one element represented by A (e.g., $A_1, A_2, \ldots A_N$) and/or more than one element represented by B (e.g., $B_1, B_2, \ldots B_N$), and can be doped with one or more dopants represented by A' (e.g., $A'_1, A'_2, \ldots A'_N$) and/or one or more dopants represented by B' (e.g., $B'_1, B'_2, \ldots B'_N$), as described above. As conventionally drawn, A-site cations occupy the corners, while B-site cations sit in the body center of the perovskite structure 204A. Three oxygen atoms per unit cell rest on the faces of the perovskite structure 204A. Various perovskite structures have, without limitation, a lattice constant close to approximately 4 Å due to the rigidity of the oxygen octahedra network and the well-defined oxygen ionic radius of 1.35 Å. Advantageously, many different cations can be substituted on both the A and B sites as dopants to achieve the various advantageous properties described herein while maintaining the overall crystal structure. According to various embodiments, a dopant atom can occupy A or B sites to form a substitutionally doped solid solutions. It will be appreciated that a dopant occupying the A sites can have very different effect on the base polar material than a dopant occupying the B sites.

Still referring to FIG. 2A, in an illustrative example of a polar layer comprising barium titanate ($BaTiO_3$), which may be a paraelectric material having a cubic perovskite structure, the A sites are occupied by Ba atoms while Ti atoms occupy the B sites and are surrounded by octahedra of O atoms, and the O atoms are located at the center of each face of the unit cell. Above a Curie temperature, which may be about 130° C. for $BaTiO_3$, in the paraelectric phase, the perovskite structure 204A may be cubic or tetragonal. In the paraelectric phase, the O atoms may occupy a mid-position with respect to each pair of O atoms on opposing faces of the unit cell. Below the Curie temperature, in the ferroelectric phase, the perovskite structure 204A may have a tetragonal structure in which the B sublattice (e.g., Ti sublattice in $BaTiO_3$) and O atoms may shift in opposite direction with respect to the Ba atoms, taken as reference. These atomic shifts may be accompanied with a small relaxation of the unit cell that becomes tetragonal (when the paraelectric phase is cubic) or further elongated tetragonal (when the paraelectric phase is tetragonal) and produce a stable polarization (e.g., about 26 $\mu C/cm^2$). In the tetragonal phase, the cubic symmetry is broken, resulting in six symmetry equivalent variants with polarization along the [100], [010] and [001] directions.

Figure 2B:
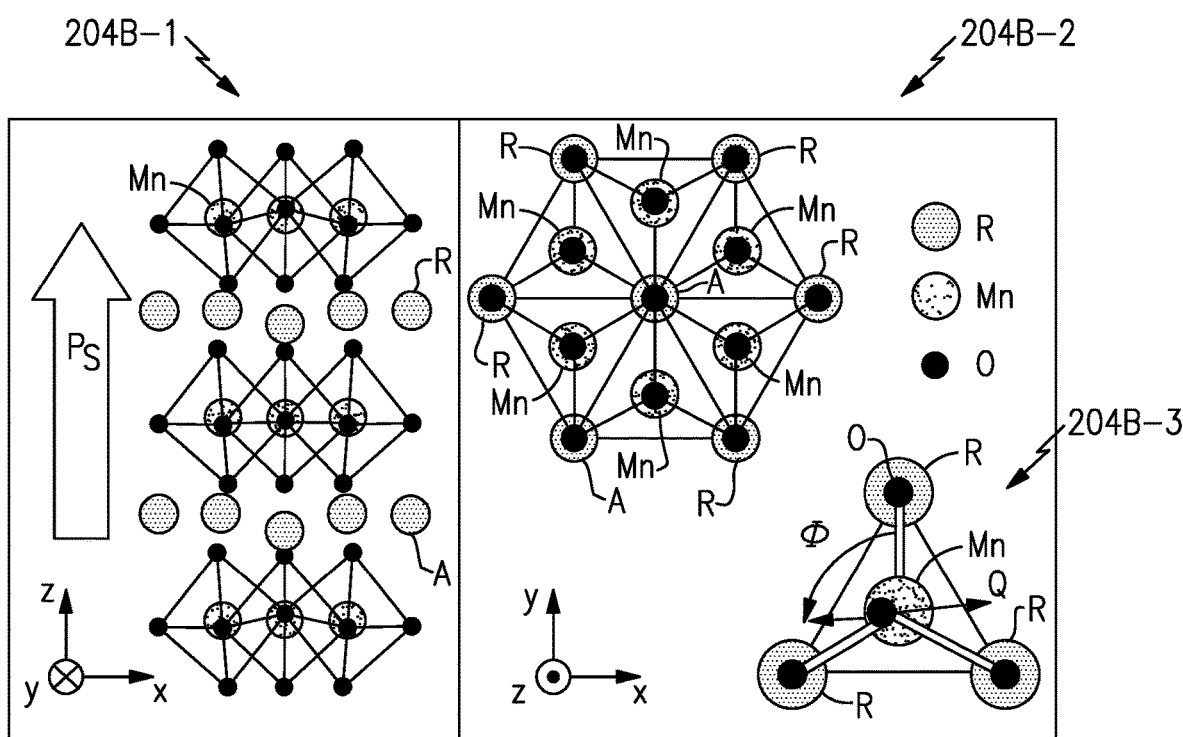
FIG. 2B schematically illustrates a hexagonal crystal structure and atomic displacements associated with switching of a polar layer, according to some embodiments.

Referring to FIG. 2B, according to some embodiments, the crystalline polar layer has a hexagonal crystal structure 204B-1/204-B-2. The hexagonal crystal structure 204-B1 represents a side view, while the hexagonal crystal structure 204-B2 represents a top view. The hexagonal crystal structure 204B-1/204-B-2 represents a crystalline oxide in a ferroelectric state, and can be represented by a chemical formula $RMnO_3$, where R represents a metal cation, Mn represents a manganese cation and O represents an oxygen anion. In these embodiments, the crystalline polar layer can have more than one element represented by R (e.g., $A_1, A_2, \ldots A_N$) occupying interchangeable atomic positions and/or more than one element in addition to Mn (e.g., $B_1, B_2, \ldots B_N$) occupying interchangeable atomic positions, and can be doped with one or more dopants represented by A' (e.g., $A'_1, A'_2, \ldots A'_N$) and/or one or more dopants represented by B' (e.g., $B'_1, B'_2, \ldots B'_N$), as described above. In some embodiments, R is an element selected from the group consisting of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The hexagonal crystal structure 204B-1 shows two layers of $MnO_5$ trigonal bipyramids and two layers of $R^{3+}$ ions. The crystalline polar layer having the hexagonal crystal structure according to embodiments can have a relatively large remnant polarization and relative high $T_C$ in the range between 600 and 1000 K. The crystalline polar layers having the illustrated hexagonal structure includes close-packed layers of $MnO_5$ bipyramids, which share corners in the ab planes (x-y plane in FIG. 2B). Along the hexagonal c axis (z direction in FIG. 2B), the layers of $MnO_5$ are well separated by the $R^{3+}$ ions. A cooperative tilting of the bipyramidal sites below the $T_C$ displaces the $R^{3+}$ ions along the c axis into two nonequivalent sites. Two of the $R^{3+}$ ions within the unit cell move up (down), and one down (up), producing a ferroelectric state. The oxygen ions are also displaced in the ab plane. Both displacements of $R^{3+}$ ions and oxygen ions contribute to the ferroelectric polarization, as illustrated in the pyramid structure 204B-3.

Figure 2C:
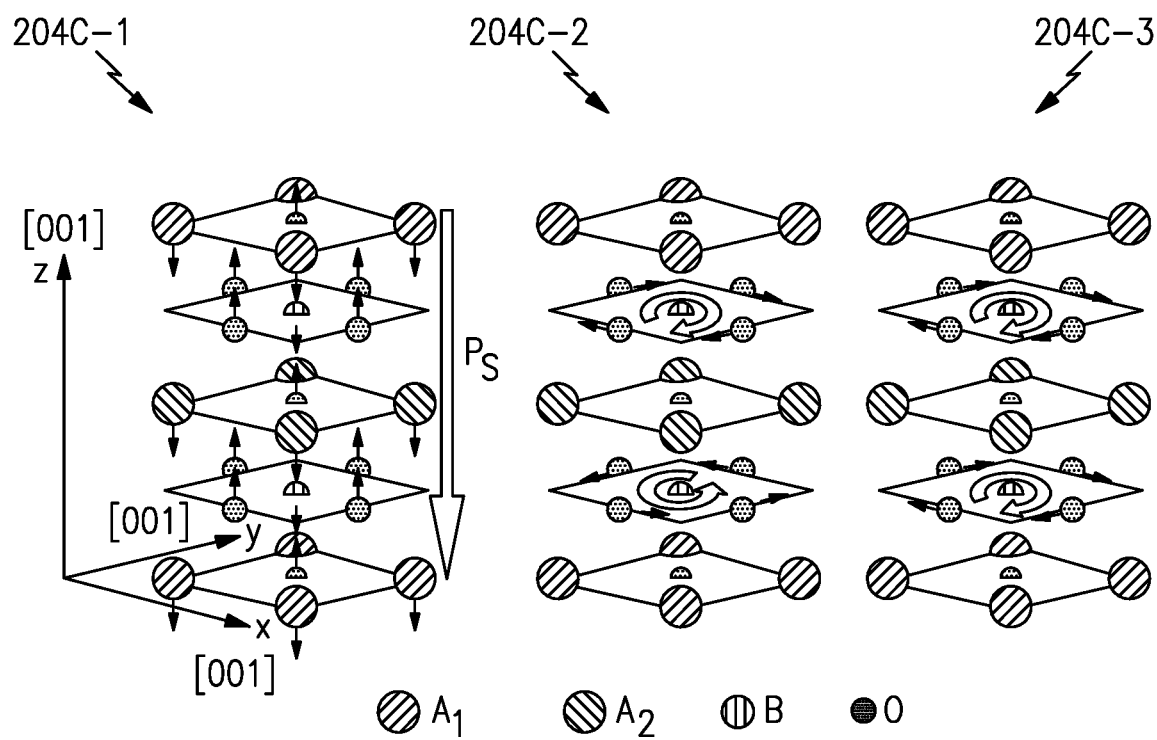
FIG. 2C schematically illustrates a superlattice crystal structure and atomic displacements associated with switching of a polar layer, according to some embodiments.

Referring to FIG. 2C, according to some embodiments, the crystalline polar layer has a superlattice structure 204C-1. The illustrated superlattice structure 204C-1 represents a crystalline oxide in a paraelectric state, which may have a chemical formula $ABO_3$, where each of A and B represents two or more metal cations and O represents an oxygen anion. For example, A may represent $A_1, A_2, \ldots A_N$, and/or B may represent $B_1, B_2, \ldots B_N$, and the polar layer can be doped with one or more dopants represented by A' (e.g., $A'_1, A'_2, \ldots A'_N$) and/or one or more dopants represented by B' (e.g., $B'_1, B'_2, \ldots B'_N$), as described above.

In various embodiments, the superlattice structures can include one or more $A_1B_1O_3$ layers that alternate with one or more $A_2B_2O_3$ layers, and can be represented as a superlattice structure $[A_1B_1O_3/A_2B_2O_3]_n$, where n is the number of alternating pairs of layers that can be 1 to 100. The superlattice structures may be ordered compounds where each of $A_1B_1O_3$ layers and $A_2B_2O_3$ layers can have two or more atomic monolayers but as few as two atomic monoloayers. In the illustrated embodiment, a unit cell may be defined by five parallel planes defined by x or [100] and y or [010] directions. In the illustrated embodiment, $B_1$ and $B_2$ are same and the unit cell has an upper half represented by the formula $A_1BO_3$ and a lower half represented by the formula $A_2BO_3$ in the z or [001] direction, where each half can be analogized to a perovskite structure 204A, with respect to the atomic positions, described above with respect to FIG. 2A. In the upper half of the unit cell, a first cation $A_1$ occupies the corners intersected by an upper face, while a second cation $A_2$ occupies the corners intersected by a lower face. B-site cations sit in the body center and three oxygen atoms per unit cell rest on the faces, in a similar manner as the perovskite structure 204A described above with respect to FIG. 2A. The lower half of the unit cell is a mirror image of the upper half with a symmetry plane being the lower face of the upper half, such that the upper face of the lower half is defined by the lower face of the upper half. Thus, in the lower half of the unit cell, the second cation $A_2$ occupies the corners intersected by an upper face, while the first cation $A_1$ occupies the corners intersected by a lower face. B-site cations sit in the body center and three oxygen atoms per unit cell rest on the faces, in a similar manner as the perovskite structure 204A described above with respect to FIG. 2A. Thus, in the [001] direction, $A_1/O$ planes having the $A_1$ cations and the O anions alternate with $A_2/O$ planes having $A_2$ cations and O anions, where a plane having the B cations and the O anions is interposed between each pair of alternating $A_1/O$ and $A_2/O$ planes, thereby forming a $A_1BO_3/A_2BO_3$ superlattice formed at an atomic layer level by alternating $A_1BO_3$ layers and $A_2BO_3$ layers. The arrows indicate various atomic motions associated with different energy lowering distortions in the $A_1BO_3/A_2BO_3$ superlattice. In the superlattice structure 204C-1, up and down arrows indicated on the $A_1$ and $A_2$ cations, B cations and O anions indicate directions of atomic displacements that an occur in some superlattice structures in response to an electric field when the polar layer undergoes a ferroelectric phase transition, thereby giving rise to a polarization ($P_S$). In the superlattice structures 204C-2 and 240C-3, rotations of oxygen atoms in the indicated directions to give rise to alternative polarization states are illustrated, depending on the material.

In various embodiments, one of the alternating layers of the superlattice structure comprising $SrTiO_3$ layers, and the other of the alternating oxide layers are represented by $A_2TiO_3$ or $A_2B_2O_3$. Still referring to FIG. 2C, the illustrative example of a polar layer having a superlattice structure comprises an ordered alloy comprising a superlattice including first layers comprising $SrTiO_3$ alternating with second layers comprising $PbTiO_3$. In this example, referring to FIG. 2C, $A_1$ cations, $A_2$ cations, and B cations represent Pb cations, Sr cations and Ti cations, respectively, such that the superlattice structure comprises $SrTiO_3$ layers (e.g., lower half of the unit cell in FIG. 2C) alternating with $PbTiO_3$ (e.g., upper half of the unit cell in FIG. 2C) represented by $[SrTiO_3/PbTiO_3]_n$. In some embodiments, the superlattice structure comprises $SrTiO_3$ layers alternating with $LaAlO_3$ represented by $[SrTiO_3/LaAlO_3]_n$.

In some embodiments, the polar layer comprises a ferroelectric oxide selected from the group consisting of $BaTiO_3$, $PbTiO_3$, $KNbO_3$, $NaTaO_3$, $BiFeO_3$ and $PbZrTiO_3$.

In some embodiments, the polar layer comprises a ferroelectric oxide selected from the group consisting of Pb(Mg,Nb)$O_3$, Pb(Mg,Nb)$O_3$–PbTiO$_3$, PbLaZrTiO$_3$, Pb(Sc,Nb)$O_3$. BaTiO$_3$—Bi(Zn(Nb,Ta))$O_3$ and BaTiO$_3$—BaSrTiO$_3$.

In some embodiments, the polar layer comprises a ferroelectric oxide selected from the group consisting of $LiNbO_3$, $LiTaO_3$, LiFeTaOF, SrBaNbO, BaNaNbO, KNaSrBaNbO.

In some embodiments, the base ferroelectric material has a hexagonal crystal structure, wherein the base ferroelectric material comprises $LuFeO_3$ or has a chemical formula represented by $RMnO_3$, and wherein R is a rare earth element.

In some embodiments, the polar layer comprises $Pb(Ti_{1-y}Zr_y)O_3$ or $Pb(Ti_{1-y-z}Zr_yNb_z)O_3$, wherein each of y and z is greater than zero.

In some embodiments, the polar layer comprises one of $(Bi_{1-x}La_x)FeO_3$, $(Bi_{1-x}Ce_x)FeO_3$ and $BiFe_{1-y}Co_yO_3$.

Conductive Oxide Electrodes Integrated with Storage Layer

The choice of materials for integrating various polar layers described herein with oxide electrodes to form capacitors, and their deposition processes, can depend on a variety of factors, including the device architecture, thermal budget, performance, reliability, difficulty of integration, environmental issues, cost, and other materials of the capacitor. Integration of the polar layers between top and bottom electrodes to form capacitors for memory devices disclosed herein faces many challenges. For example, some polar layers such as ferroelectric oxides are deposited in an oxygen-containing atmosphere at relatively high temperatures (e.g., 300° C.-800° C.), and at least one of the electrodes (e.g., the bottom electrode on which the polar layer is formed) should be resistant to oxidation under these conditions and be able to withstand the processing conditions of the polar oxide. For this reason, some polar layers in the industry have been integrated with oxidation-resistant noble metals, such as Pt and Pd. However, because noble metals are difficult to etch and have poor adhesion, their integration has been limited in the industry. Furthermore, noble metals can form deep levels in the underlying Si substrate when diffused therein and severely degrade transistor performance. In addition, some electrodes can detrimentally influence the ferroelectric properties of the polar layer, e.g., reduce the remnant polarization.

In addition, the inventors have discovered that, by engineering the material composition and the crystal structure of the upper and lower electrodes comprising conductive oxides according to embodiments described herein, various ferroelectric characteristics of the ferroelectric capacitor may be maintained or improved, including the switching voltage, switching time, remnant polarization, saturation polarization, coercive field, ferroelectric transition temperature, electrical conductivity of the electrodes and leakage current, to name a few. For example, as described above, conventional ferroelectric capacitors, e.g., those including Pt electrodes, can give rise to an interfacial layer between the polar layer and the electrode(s), which can lead to charge injection and screening effects, thereby increasing the effective coercive field of the polar layer. Unlike the conventional ferroelectric stacks, the engineered electrodes according to embodiments described herein can reduce or eliminate these effects. Furthermore, the upper and lower electrodes comprising conductive oxides according to embodiments described herein can serve as a diffusion barrier and enable the integration of various polar layers described above without using noble metals such as Pt or Pd that are difficult to integrate.

To address these and other objectives, according to various embodiments, a capacitor stack comprises first and second crystalline conductive or semiconductive oxide electrodes on opposing sides of a polar layer, wherein the polar layer can be any of the polar layers disclosed herein. In various embodiments, the polar layer comprises any crystalline base polar material doped with a dopant as described herein. The base polar material includes one or more metal elements and one or both of oxygen or nitrogen, wherein the dopant comprises a metal element that is different from the one or more metal elements and is present at a concentration such that a remnant polarization of the polar layer is different than that of the base polar material without the dopant by more than about 5 $\mu C/cm^2$. The capacitor stack additionally comprises first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes. In some other embodiments, a semiconductor device comprises a capacitor stack, which in turn comprises a crystalline polar layer comprising a base polar material substitutionally doped with a dopant. The base polar material comprises a metal oxide having one of a perovskite structure, a hexagonal crystal structure or a superlattice structure. The dopant comprises a metal of one of 4d series, 5d series, 4f series or 5f series that is different from metal(s) of the metal oxide. The capacitor stack further comprises first and second crystalline conductive or semiconductive oxide electrodes on opposing sides of the crystalline polar layer, wherein the crystalline polar layer has the same crystal structure as one or both of the first and second crystalline conductive or semiconductive oxide electrodes. An example capacitor stack that can achieve these desirable effects is illustrated with respect to FIG. 3.

Figure 3:
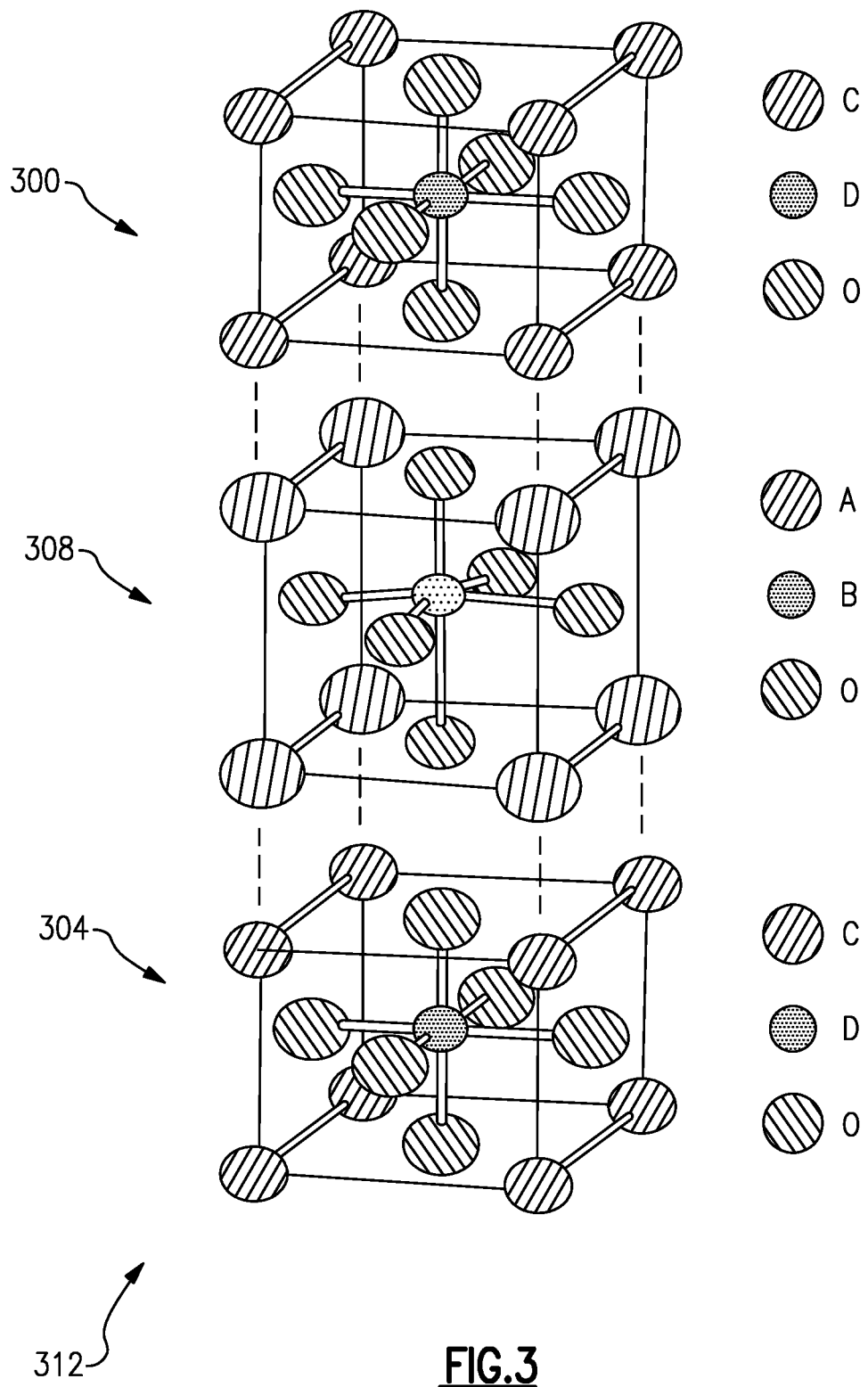
FIG. 3 schematically illustrates crystal structures of layers of a capacitor comprising first and second conductive oxide electrode layers and a polar layer interposed therebetween having matching crystal structures, according to various embodiments.

FIG. 3 schematically illustrates crystal structures of the layers of a capacitor stack 312 comprising first (lower) and second (upper) conductive or semiconductive oxide electrodes 304, 300 and a polar layer 308 interposed therebetween and having a matching crystal structure, according to some embodiments. In the illustrated embodiment, the matching crystal structure is a perovskite structure, as described above with respect to FIG. 2A. In this embodiment, the polar layer 308 comprises a ferroelectric oxide having a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero. As described above, A can represent one or more alloying elements that form a solid solution, A can represent one or more alloying elements that form a solid solution and each of A' and B' can represent one or more dopants. One or both of the first and second conductive or semiconductive oxide electrodes 304, 300 comprise an oxide having a chemical formula represented by $C_{(p-u)}C'_uD_{(q-v)}D'_vO_w$, wherein C and C' occupy interchangeable atomic positions in the perovskite crystal structure, wherein D and D' occupy interchangeable atomic positions in the perovskite crystal structure, wherein p, q and w are integers, and wherein one or both of u and v are greater than zero. Additional elements (e.g., C", C"', etc.) can occupy interchangeable atomic positions with C and C', and additional elements (e.g., D", D"', etc.) can occupy interchangeable atomic positions with D and D' to form solid solutions. The different elements and their atomic fractions can be tuned to tune the lattice constant to more closely match that of the polar layer 308, and/or to tune the resistivity, among other parameters.

In various embodiments disclosed herein, the compositions of the polar layer 308 and the first and second conductive or semiconductive oxide electrodes 304, 300 can be tuned such that the polar layer 308 has a lattice constant that is matched within about 25%, 20%, 15%, 10%, 5%, 2%, 1%, 0.5%, 0.2%, 0.1%, or a percentage in a range defined by any of these values, of a lattice constant of one or both of the first and second conductive or semiconductive oxide electrodes 304, 300 that are contacting the polar layer 308.

At least portions of the polar layer 308 and one or both of the first and second conductive or semiconductive oxide electrodes 304, 300 may be pseudomorphic or pseudomorphically strained. For example, according to embodiments, the polar layer 308 has a region having a lateral dimension between about 10 nm and 500 nm that is pseudomorphic with the first and second conductive or semiconductive oxide electrodes 304, 300. The pseudomorphic region can correspond to, e.g., a grain of the polar layer 308. Without being bound to any theory, a person having ordinary skill in the art would appreciate that whether or not pseudomorphicity is achieved depends on, among other factors, the thickness of the layers and the lattice mismatch, where at least partial pseudomorphicity can be achieved so long as the strain energy is below a critical energy for formation of misfit dislocation. The inventors have realized that the relatively low lattice mismatch and at least partial pseudomorphic formation of the layers can reduce contact resistance, thereby contributing to enablement for low voltage switching (e.g., <1200 meV) of a ferroelectric capacitor, as described herein. In addition, by engineering the material composition and the crystal structure of a lower electrode on which the crystalline polar layer is formed, at least a portion of the crystalline polar layer such as one or more grains may be epitaxially grown, such that the in-plane lattice constant and/or crystal symmetry of the lower electrode may be imposed on the crystalline polar layer formed thereon. Without being bound to any theory, the epitaxial strain resulting from the lattice mismatch between the polar layer and the first and/or second crystalline conductive or semiconductive oxide electrodes can strongly couple with the polar layer. Under some circumstances, new phase(s), not present in the bulk phase diagram of the polar layer can be epitaxially stabilized, strain-engineering may be possible to tune specific ferroelectric properties to desired values, and/or misfit dislocations may partly or fully relieve the strain to tune the ferroelectric properties.

Thus, to derive these and other benefits, according to various embodiments described herein, one or both of the first and second conductive or semiconductive oxide electrodes 304, 300 have a thickness between about 0.5 and 5 nm, 5 and 10 nm, 10 and 15 nm, 15 and 20 nm, 20 and 25 nm, 25 and 30 nm, 30 and 35 nm, 35 and 40 nm, 40 and 45 nm, 45 and 50 nm, or a thickness in a range defined by and inclusive of any of these values. Furthermore, the thickness may also be optimized to reduce the series voltage added to the switching voltage by the bulk resistance of the electrodes.

In some embodiments in which the polar layer 308 has a perovskite structure as disclosed above, one or both of the first and second conductive or semiconductive oxide electrodes 304, 300 comprise an oxide selected from the group consisting of $(La,Sr)CoO_3$, $SrRuO_3$, $(La,Sr)MnO_3$, $YBa_2Cu_3O_7$, $Bi_2Sr_2CaCu_2O_8$, $LaNiO_3$, $SrRuO_3$, $LaMnO_3$, $SrMnO_3$, $LaCoO_3SrCoO_3$ or $IrO_3$.

In some embodiments, a thin layer (e.g., 5 nm-15 nm) of one or both of the first and second conductive or semiconductive oxide electrodes 304, 300 having a perovskite structure may serve as a template on which the polar layer 308 having a perovskite structure is formed or grown to achieve various advantages including strain engineering, low contact resistance and preservation or enhancement of ferroelectric properties of the polar layer 308, as described above. However, further improvement in the overall performance of the electrodes may be achieved by forming a stack with a further electrode. For example, the further electrode may provide higher electrical conductivity, such that a first electrode stack including the first conductive or semiconductive oxide electrode 304 and a first further electrode formed thereon may provide a lower overall electrical resistivity relative to the first conductive or semiconductive oxide electrode 304 having a comparable or the same thickness. Similarly, a second electrode stack including the second conductive or semiconductive oxide electrode 300 and a second further electrode formed thereon may provide a lower overall electrical resistivity relative to the second conductive or semiconductive oxide electrode 300 having a comparable or the same thickness. Furthermore, the further electrode may serve as a diffusion barrier, e.g., for oxygen diffusion. The inventors have discovered that these and other advantages can be achieved using a further electrode comprising a conductive binary oxide. In these embodiments, the polar layer 308 directly contacts one or both of the first and second conductive or semiconductive oxide electrodes 304, 300, and the capacitor further comprises a further electrode formed on one or both of first and second conductive or semiconductive oxide electrodes 304, 300, wherein the further electrode comprises a conductive binary metallic oxide selected from the group consisting of an iridium (Ir) oxide, a ruthenium (Ru) oxide, a tellurium oxide, a palladium (Pd) oxide, an osmium (Os) oxide or a rhenium (Re) oxide. While the binary oxides have a non-perovskite structure, they provide higher conductivity, and a conductive or semiconductive oxide electrode having a perovskite structure formed thereon can provide a seed or a template for the growth, e.g., epitaxial growth, of the polar layer 308 having a perovskite structure at relatively low temperatures.

As described herein, one or both of the first and second conductive or semiconductive oxide electrodes 304, 300, or one or both of the first and second electrode stacks comprising the first and second conductive or semiconductive oxide electrodes 304, 300, respectively, have sufficiently high electrical conductivity such that they can serve as a conductive electrode suitable for low voltage switching, e.g., <1200 meV. Accordingly, in various embodiments, one or both of the first and second conductive or semiconductive oxide electrodes 304, 300 or one or both of the first and second electrode stacks comprising the first and second conductive or semiconductive oxide electrodes 304, 300, respectively, have a resistivity lower than about 0.1, 0.05, 0.02, 0.01, 0.005, 0.002, 0.001, 0.0005 Ohms-cm, or a resistivity in a range defined by any of these values.

While in the above description with respect to FIG. 3, the illustrated example of a matching crystal structure between the polar layer 308 and one or both of the first and second conductive or semiconductive oxide electrodes 304, 300, is a perovskite structure, embodiments are not so limited, and it will be appreciated that the various materials and stack combinations described herein for the first and second conductive or semiconductive oxide electrodes 304, 300 having a perovskite structure can be integrated with a polar layer 308 having a superlattice structure described above with respect to FIG. 2C, according to some other embodiments.

In yet some other embodiments, the matching crystal structure between the polar layer 308 and one or both of the first and second conductive or semiconductive oxide electrodes 304, 300 may be a hexagonal structure as described above with respect to FIG. 2B.

In yet some other embodiments, the crystal structure of one or both of the first and second conductive or semiconductive oxide electrodes 304, 300 may be a delaffosite structure, a spinel structure or a cubic structure. In these embodiments, one or both of the first and second conductive or semiconductive oxide electrodes 304, 300 may comprise one or more of $PtCoO_2$ and $PdCoO_2$, Al-doped ZnO and other conductive oxides having a delafossite structure that can be integrated with polar layers having a hexagonal crystal structure; and $Fe_3O_4$, $LiV_2O_4$ and other oxides having a spinel structure and/or Sn-doped $In_2O_3$ having a cubic structure that can be integrated with polar layers having a perovskite or superlattice structure, among others.

Polar Layer Design for Low Voltage Switching and Nonvolatility of Ferroelectric Capacitors by Doping a Base Polar Material As discussed above, a ferroelectric capacitor for a semiconductor device, e.g., FeRAM device, in which the polar layer has a relatively high remnant polarization while having a relatively low ferroelectric transition voltage for ultra-low voltage applications has been difficult to achieve. In addition, designing the polar layer for nonvolatile memory applications, e.g., such that data can be read after at least 10 years at room temperature, has faced even greater challenge. To address these and other needs, in the following, a design approaches for a ferroelectric capacitor, e.g., for an FeRAM, that is capable of being switched at ultra-low voltages (e.g., <1200 mV) while simultaneously displaying relatively high remnant polarization (e.g., >10 $\mu C/cm^2$) for nonvolatile memory applications, is disclosed. According to various embodiments, a capacitor comprises a polar layer comprising a crystalline base polar material doped with a dopant as described herein. The base polar material includes one or more metal elements and one or both of oxygen or nitrogen, wherein the dopant comprises a metal element that is different from the one or more metal elements and is present at a concentration such that a ferroelectric switching voltage of the capacitor or the polar layer is different than that of the base polar material without the dopant by more than about 100 mV, and/or that a remnant polarization of the polar layer is different than that of the base polar material without the dopant by more than about 5 $\mu C/cm^2$. The capacitor stack additionally comprises first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes Using the design approach described herein, a capacitor or the storage layer 104 (FIG. 1A) included therein has a switching voltage that is lower than about 1200 mV, 1100 mV, 1000 mV, 900 mV. 800 mV, 700 mV, 600 mV, 500 mV, 400 mV, 300 mV, 200 mV, 100 mV, or a voltage in range defined by any of these values below the ferroelectric transition temperature. In addition, the storage layer 104 (FIG. 1A) can have a remnant polarization of 5-30 $\mu C/cm^2$, 30-50 $\mu C/cm^2$, 50-70 $\mu C/cm^2$, 70-90 $\mu C/cm^2$, 90-110 $\mu C/cm^2$, 110-130 $\mu C/cm^2$, 130-150 $\mu C/cm2$, or a value in a range defined by any of these values.

Figure 4A:
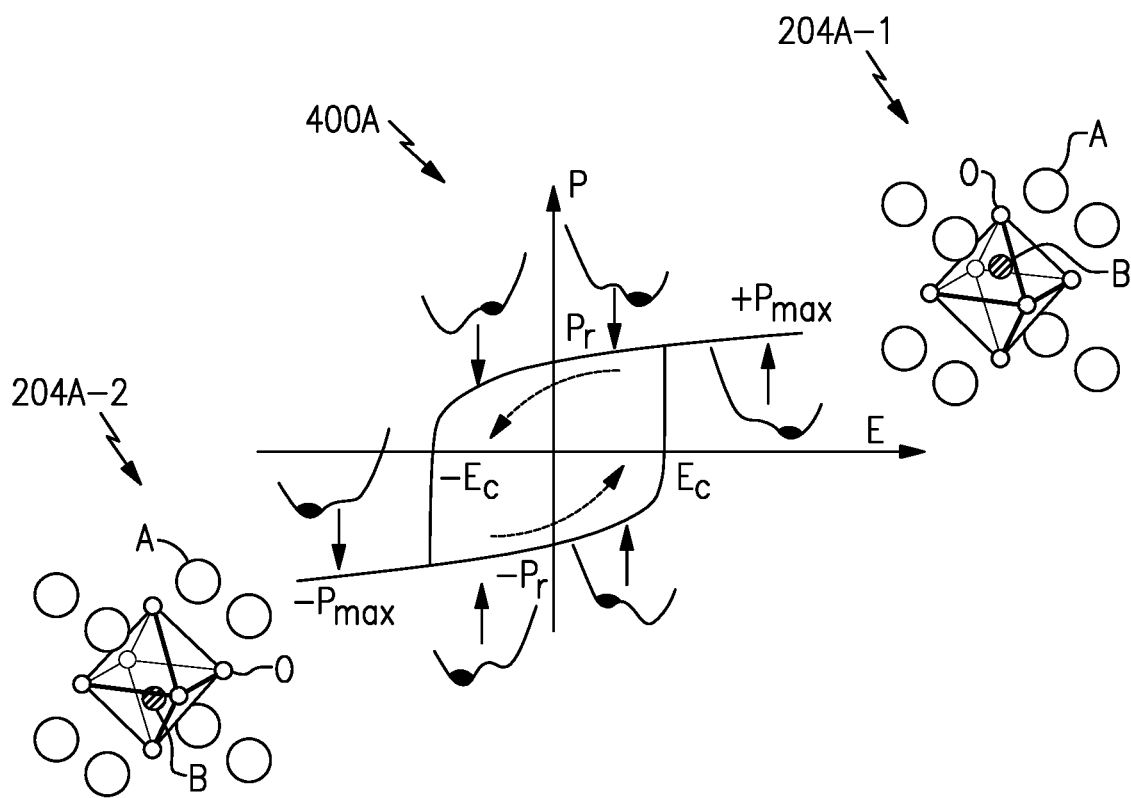
FIG. 4A schematically illustrates a polarization-field (P-E) loop with a hysteresis, an associated double well of a free energy curve and associated atomic displacements corresponding to ferroelectric transitions between polarization states of a ferroelectric material.

FIG. 4A schematically illustrates a polarization-field (P-E) loop 400A associated with a hysteresis caused by a potential barrier between two wells of a double well curve corresponding to switching by ferroelectric transitions between stable remnant polarization states, and the associated atomic displacements. As described above with respect to FIGS. 2A and 1B, the P-E loop 400A is characterized by, starting with a polarization P=0 at which the polar layer is in a paraelectric phase having the paraelectric perovskite structure 204A (FIG. 2A), an increasing polarization with increasing field until it reaches saturation at +Pmax. After the saturation is reached at +Pmax, when the electric field is subsequently reduced, at E=0, a remnant polarization +Pr remains, and the polar layer is in a first ferroelectric phase. Below the Curie temperature, in the first ferroelectric phase, the perovskite structure 204A-1 may have a tetragonal structure in which the B sublattice and O atoms may shift in opposite direction with respect to the A atoms, taken as reference. Upon application of an increasing negative electric field until reaching saturation at −Pmax, and subsequently reducing the electric field back to E=0, a remnant polarization −Pr remains, and the polar layer is in a second ferroelectric phase. Below the Curie temperature, in the second ferroelectric phase, the perovskite structure 204A-2 may have a tetragonal structure in which the B sublattice and O atoms may shift in opposite directions with respect to the A atoms, taken as reference, and in opposite respective directions with respect to the first ferroelectric phase.

Figure 4B:
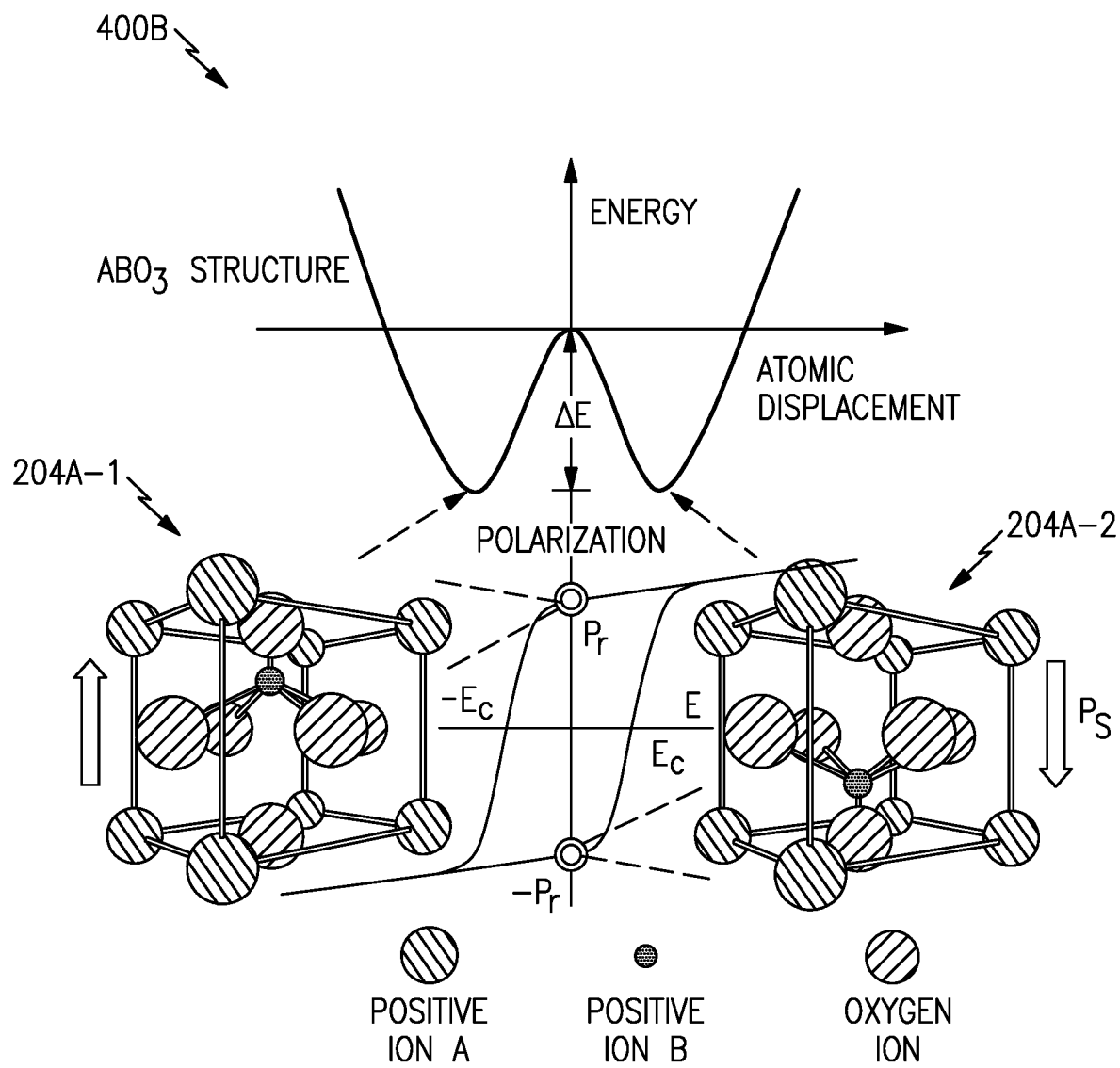
FIG. 4B schematically illustrates a free energy curve exhibiting a double well of a free energy curve and associated atomic displacements corresponding to ferroelectric transitions in a ferroelectric material having a perovskite crystal structure.

FIG. 4B illustrates a schematic free energy curve 400B exhibiting a double well potential corresponding to switching by ferromagnetic transitions between remnant polarization states and the associated atomic displacements for a ferroelectric layer having a perovskite crystal structure. For illustrative purposes only and without limitation to the crystal structure of the polar layer, the ferroelectric switching phenomenon in a polar layer is described herein with respect to a polar layer having a perovskite structure. As illustrated, two local minima in the double well potential free energy curve 400B represent first and second ferroelectric states having remnant polarizations +Pr and −Pr, represented by the tetragonal perovskite structures 204A-1 and 204A-2, respectively. The two ferroelectric states are separated by a double well energy barrier ΔE. The inventors have recognized that, by lowering this energy barrier of the free energy curve while maintaining a relatively large polarization values, the ferroelectric capacitors having ultra-low transition voltages and nonvolatile memory states can be obtained.

Figure 4C:
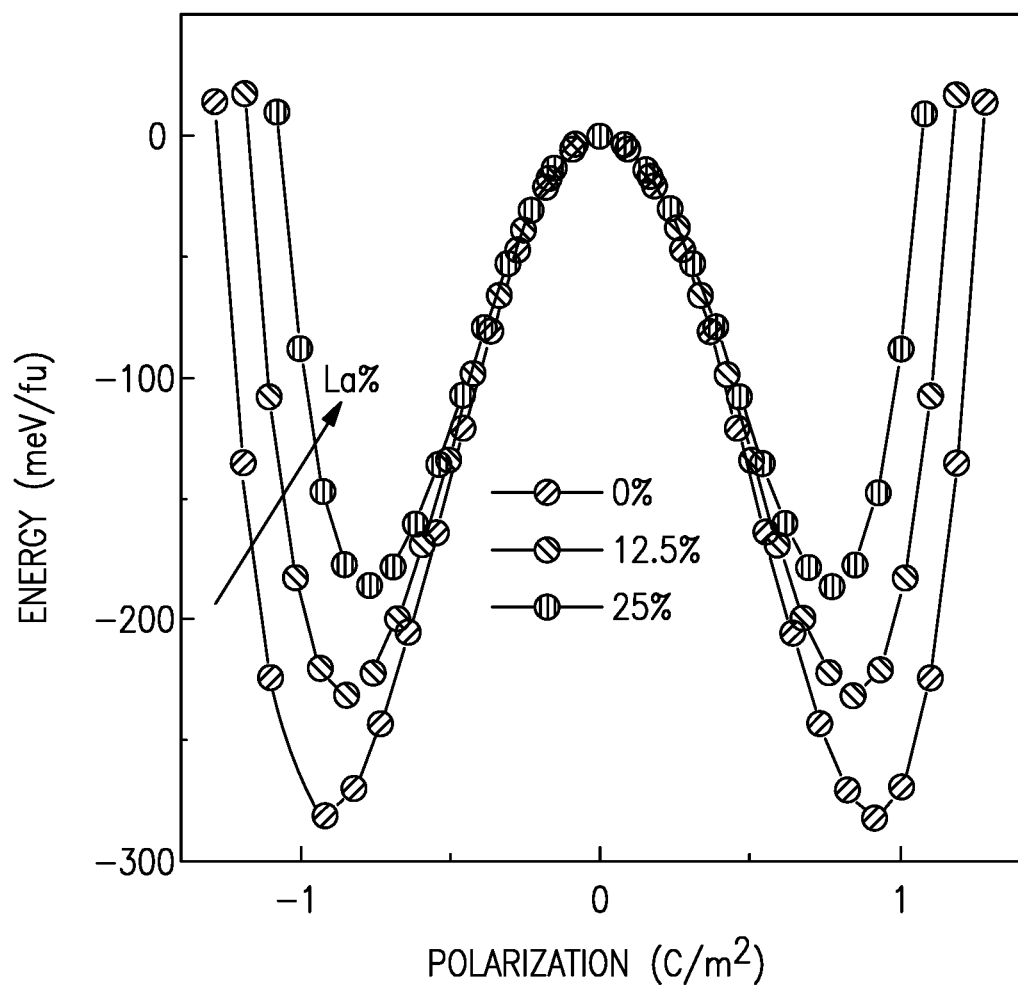
FIG. 4C is a graph showing calculations of a free energy curve of a ferroelectric layer formed by doping a base ferroelectric material with varying amounts of a dopant, thereby tuning the double well of the free energy curve, according to embodiments.

FIG. 4C is a graph 400C showing calculations of the double well potential of the free energy curve of a ferroelectric oxide layer formed by doping a base ferroelectric oxide layer with varying amounts of a dopant, thereby tuning the energy barrier between stable remnant polarization states, for achieving an ultra-low transition ferroelectric transition voltage, according to embodiments. In the illustrated example, the base ferroelectric oxide used for the calculation is PbZrTiO$_3$, and the dopant is La substitutionally interchangeably occupying A sites of the perovskite structure, such that the polar layer comprises PbLaZrTiO$_3$. In the illustrated example, the base ferroelectric oxide has a starting remnant polarization of about 90 μC/cm$^2$ and a starting double well potential of about 290 meV. Upon adding up to 25% of La, the double well energy barrier has reduced by about 100 meV to about 190 meV, accompanied by a reduction in remnant polarization by about 15 μC/cm$^2$. The example calculation demonstrates compositions that satisfy a polar layer suitable for nonvolatile memory, which is capable of being switched at ultra-low voltages as low as about 200 mV, while simultaneously displaying relatively high remnant polarization of about 75 μC/cm$^2$ for nonvolatility.

The inventors have discovered that the approach in the illustrated example can be generalized to various base polar material and dopants described herein, depending on the application-dependent parameters, e.g., the transition (e.g., switching) voltage and/or remnant polarization. According to embodiments, the starting base ferroelectric oxide has a relatively high remnant polarization, e.g., to account for reduction in the same with doping, as illustrated with respect to FIG. 4C, and for the desired level of nonvolatility. According to embodiments, when the base polar material is a base ferroelectric material, the composition of the base ferroelectric material is selected or tuned such that the remnant polarization of the base ferroelectric material and the remnant polarization of the doped polar material is about 5-30 μC/cm$^2$, 30-50 μC/cm$^2$, 50-70 μC/cm$^2$, 70-90 μC/cm$^2$, 90-110 μC/cm$^2$, 110-130 μC/cm$^2$, 130-150 μC/cm$^2$, or a value in a range defined by any of these values. Depending on the application, when the base polar material is a base ferroelectric material, the composition of the base ferroelectric material is selected or tuned such that the double well energy barrier of the base ferroelectric material and the double well barrier of the doped polar material is 200-300 meV, 300-400 meV, 400-500 meV, 500-600 meV, 600-700 meV, 700-800 meV, 900-1000 meV, or a value in a range defined by any of these values. To the starting base ferroelectric material having relatively high remnant polarization and relatively high double well energy barrier, a dopant as described herein is added. The added dopant can lower the double well energy barrier by 0-100 meV, 100-200 meV, 200-300 meV, 300-400 meV, 400-500 meV, or a value in a range defined by any of these values. The added dopant can lower the remnant polarization by about 5%, 10%, 20%, 30%, 40%, 50%, 60%, 70%, or a value in a range defined by any of these values.

The inventors have discovered that the double well potential tuning approach can also enable tuning the ferroelectric capacitor for high data retention performance. After establishing a remnant polarization, the ferroelectric state cannot ideally retain its remnant polarization indefinitely because of various effects that can cause backswitching. The polarization slightly decreases with time, which may be referred to as retention loss, which is characterized by the difference between switching and non-switching charge becoming smaller over time. The retention loss is observed as a long-term relaxation of the remnant polarization of the hysteresis, which can be determined by measuring the retained charge, e.g. by means of a read pulse, after a certain period of time when the state was stored by a write pulse.

For many nonvolatile memory applications, the ferroelectric capacitor should store the digital information longer than 10 years, e.g., at least at room temperature. Without being bound to any theory, the polarization may follows a logarithmic decay that begins at to with the decay rate m, which can be expressed generally by an expression such as:

$$P(t)=P(t_0)-m \log(t/t_0),$$

where:

$$m \propto \exp(-W/kT),$$

where W is an activation energy and k is the Boltzmann constant, which can be related to the double well potential described above. When the remnant polarization falls below a critical threshold value $P_C$ at t=$t_C$, a sense amplifier may no longer be able to distinguish between the memory states. The retention loss can be analyzed statistically using an expression such as:

$$\log \log(t_C/t_0) \propto (W/kT).$$

The inventors have discovered that, when the double well potential and the remnant polarization of a ferroelectric capacitor is according to various embodiments disclosed herein, the retention loss may not cause a data retention failure after at least 10 years at a temperature at or exceeding room temperature.

Figure 5:
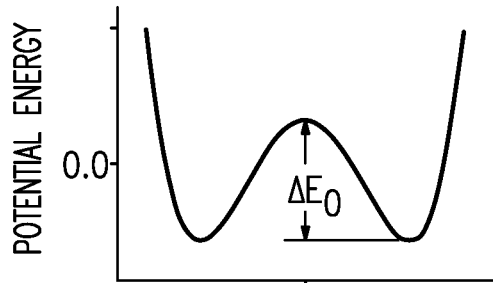
FIG. 5 schematically illustrates energy considerations of switching and nonvolatile storage in a ferroelectric memory device, according to embodiments.
Figure 5:
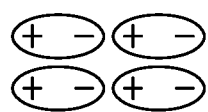
Figure 5:
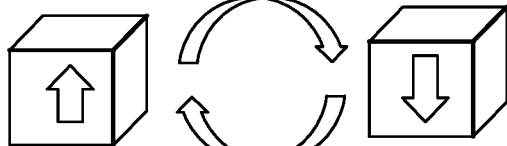

FIG. 5 schematically illustrates, without being bound to any theory, energy considerations of switching and nonvolatile storage in semiconductor devices comprising a ferroelectric capacitor, according to embodiments. The inventors have discovered that, as described above, the energy barrier for data retention loss can be associated with, e.g., proportional to, the double well potential of the free energy curve described above with respect to FIGS. 4A-4C. Without being bound to any theory, the energy barrier E(P) for data retention can be related an order parameter P as expressed by Ginzburg-Landau theory as:

$$F(P,T) = g_2 P^2/2 + g_4 P^4/4 + g_6 P^6/6 - PE/2$$

where $g_2$, $g_4$ and $g_6$ are coefficients and PE is potential energy. The minima of first and second derivatives of F(P,T) define the phase transitions. Advantageously, based on double well potential barriers described above for ferroelectric capacitors according to embodiments, a ratio ($\lambda$) of switching energy $E_{SWITCH}$ and the energy barrier for retention for memory devices can be on the order of unity. Similar ratio for some other memory technologies can be much higher, e.g., two orders of magnitude higher, for some spin torque transfer memory technologies.

Dopant Engineering for Polar Layers for Ferroelectric Capacitors

As described above, in various embodiments, to achieve a ferroelectric capacitor according to embodiments for a semiconductor device, e.g., FeRAM device, in which the ferroelectric oxide layer has a relatively high remnant polarization while having a relatively low ferroelectric transition voltage, a ferroelectric capacitor is formed by doping a base polar material having a relatively high remnant polarization to tune, e.g., lower the double well energy barrier of the free energy curve (e.g., FIG. 4B). In the following, engineering the dopants to achieve these and other objectives are described.

Figure 6:
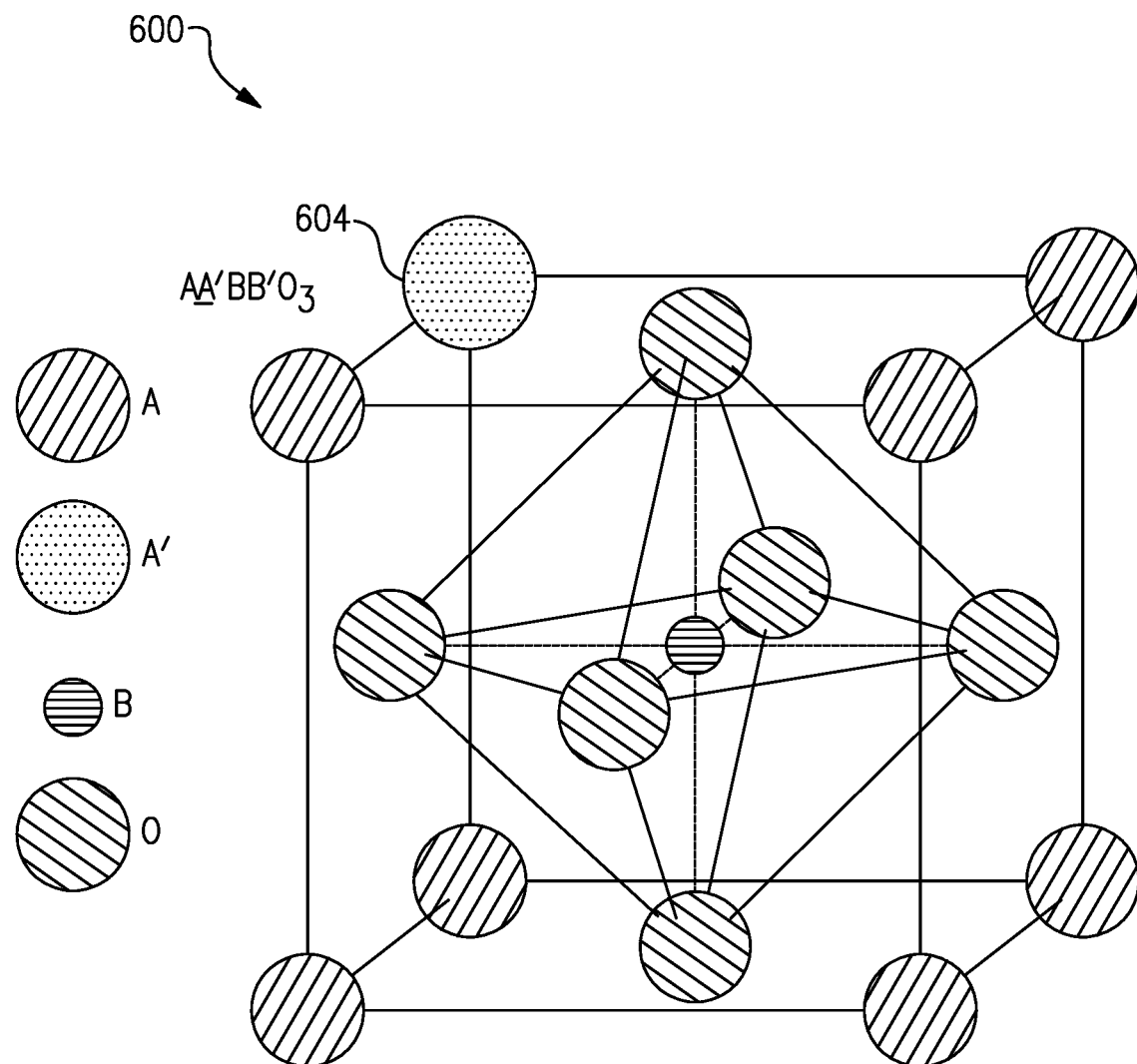
FIG. 6 illustrates a schematic perovskite crystal structure of a polar layer doped with a dopant A' that can replace atoms of the metal A occupying corner positions in a base polar material having a chemical formula $ABO_3$, according to embodiments.

As described above, the polar layer comprises a ferroelectric oxide having a chemical formula represented by $A_{(m-x)}A'_xB_{(n-y)}B'_yO_z$, wherein m, n and z are integers, and wherein one or both of x and y are greater than zero. A and A' are metals that occupy interchangeable atomic positions in the crystal structure and B and B' are metals that occupy interchangeable atomic positions in the crystal structure. One or both of the A' and the B' may be dopants. As described above, an A' ion can have a different oxidation state relative to the A ion it replaces, and/or B' ion can have a different oxidation state relative to the B ion it replaces. Thus, in these embodiments, the ferroelectric oxide comprises a base polar material, which may be represented by a base chemical formula $A_mB_nO_z$, that is doped with one or more dopants A' and/or B' to have the chemical formula $A_{(m-x)}A'_xB_{(n-y)}B'_yO_z$. In the following, engineering of dopants A' and B' that occupy different atomic sites within the crystal structure and their advantageous effects are described. In FIG. 6, dopants corresponding to A' are described, and in FIG. 7, dopants corresponding to B' are described.

FIG. 6 illustrates a schematic perovskite crystal structure 600 of a polar layer doped with a dopant A' 600 that can replace atoms of the metal A occupying corner positions in a base polar material having a chemical formula $ABO_3$, according to embodiments. For illustrative purposes, dopant engineering is described for a polar layer having a perovskite structure. However, the inventive concepts described herein can apply in a similar manner to polar layers having other crystal structures including hexagonal crystal structures and superlattice structures.

As described above, the A' dopants occupy corner positions of a unit cell of a perovskite structure. A' can have a different oxidation state as the A atom it replaces. A' dopants and their concentration can be selected to tune, among other parameters and without limitation, switching parameters such as the switching voltage and/or remnant polarization. Without being bound to any theory, the switching parameters can be tuned by, e.g., tailoring the double well potential of the free energy curve as discussed above (e.g., FIG. 4B). In polar layers having a superlattice structure as described above with respect to FIG. 2C, the switching parameters can be tuned by varying the mode or degree of atomic motions associated with polarization, as described above with respect to FIG. 2C. The A' dopants can be selected, among other factors, based the capability of being substitutionally replace the A atoms, e.g., while having a different oxidation state than the A atoms, which in turn can depend on valency and atomic radii, among other factors, and a difference in the atomic polarizability ($\alpha$) of A' dopants relative to the A atoms in the crystal structure. In various embodiments, the $\alpha$ of the A' dopant may be about 2%, 5%, 10%, 20%, 50%, 100%, 200%, 500%, 1000%, 2000% or a percentage in a range defined by any of these values, relative to the $\alpha$ of the A atom for tuning the switching voltage.

According to various embodiments, A' can be a metal of one of 4d series, 5d series, 4f series or 5f series. For example, the A' can be a lanthanide element, such as La of 4f series in the illustrated example implementation in FIG. 4C, or Nb in the 4d or 5d series.

According to embodiments, the amount of A' can be 0.1-5 atomic %, 5-10 atomic %, 10-15 atomic %, 15-20 atomic %, 20-25 atomic % or an atomic % in a range defined by any of these values, for instance between 0.1-20 atomic %.

Figure 7:
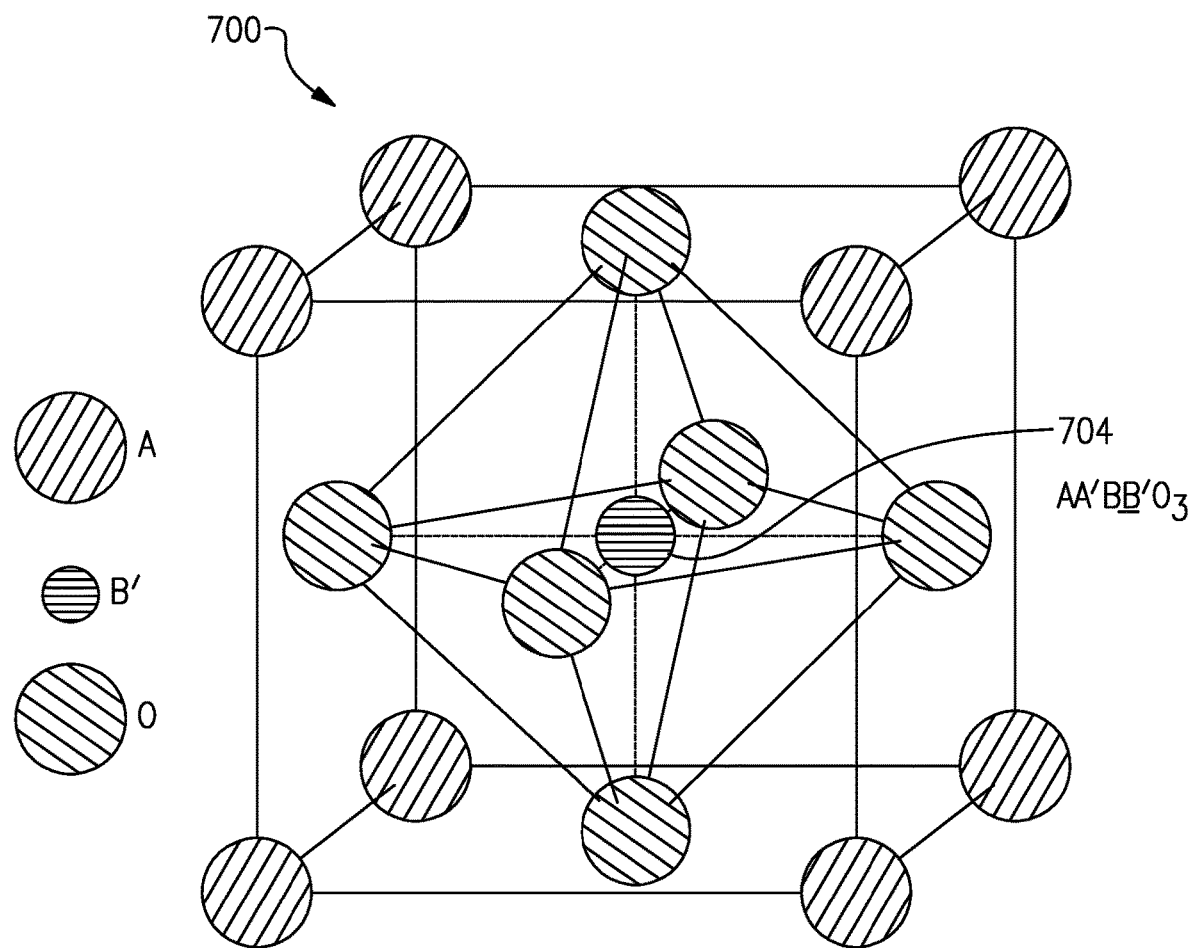
FIG. 7 illustrates a schematic perovskite crystal structure of polar layer doped with a dopant B' that can replace atoms of the metal B occupying the center position in a base polar material having a chemical formula $ABO_3$, according to embodiments.

FIG. 7 illustrates a schematic perovskite crystal structure of polar layer doped with a dopant B' that can replace atoms of the metal B occupying the center position in a base polar material having a chemical formula $ABO_3$, according to embodiments. As described above, the B' dopants occupy center positions of a unit cell of a perovskite structure. B' dopants and their concentration can be selected to tune, among other parameters and without limitation, charge transfer characteristics, such as leakage current. The B' dopants can be selected, among other factors, based the capability of being substitutionally replace the B atoms, e.g., while having a different oxidation states than the B atoms, which in turn can depend on valency and atomic radii, among other factors. The inventors have discovered that transition metal of 3d series can be particularly advantageous reducing charge transfer under field in the polar layer.

According to embodiments, the B' is transition metal element having a relatively low atomic number. For example, B' can be an element selected from the group consisting of Mn, Sc, Ti, V, Cr, Co, Ni, Cu, Zn or other 4d series metals.

According to embodiments, the amount of B' can be 0.1-5 atomic %, 5-10 atomic %, 10-15 atomic %, 15-20 atomic %, 20-25 atomic % or an atomic % in a range defined by any of these values, for instance between 0.1-20 atomic %.

Diffusion Barriers

As described above, various layers of ferroelectric capacitors described herein comprise various chemical elements at specific concentrations, which in turn can be important for device characteristics such as low voltage operation and high remnant polarization. To maintain the device characteristics through fabrication and post fabrication usage, the chemical compositions and interfaces of the layers of the ferroelectric capacitors should be maintained through different processing steps. In addition, some elements in the ferroelectric capacitors can adversely affect other circuitry of the integrated circuit. In particular, the ferroelectric capacitors according to some embodiments are formed as part of the back end of the line (BEOL), after CMOS devices such as transistors are formed in the front end of the line (FEOL). As a result, diffusion of chemical elements from the ferroelectric capacitor to the surrounding features associated with the CMOS circuitry that can cause various failures. Conversely, diffusion of chemical elements from the ferroelectric capacitors to the surrounding features associated with the CMOS circuitry. For example, as described above with respect to integration of electrodes, subsequent processes for fabrication, e.g., for forming a polar layer comprising an oxide, may be under an oxidizing environment at relatively high temperatures (e.g., 500° C.-800° C.). Thus, a diffusion barrier layer may needed to suppress the diffusion of oxygen from the ferroelectric capacitor region to the features associated with the CMOS circuitry. For example, the ferroelectric capacitor may be formed on a contact via or plug that electrically connects to a transistor, e.g., a drain of the transistor. The contact via or plug may be formed of, e.g., polycrystalline Si, W or $WSi_x$. As a result, an oxygen barrier may serve to maintain the electrical contact between the transistor and the lower electrode of the ferroelectric capacitor by suppressing the oxidation of the contact via and/or a reaction between the lower electrode and the contact via. Furthermore, reactions between the barrier itself and either the contact via and the lower electrode have to be suppressed. To serve these and other needs, ferroelectric capacitors according to embodiments can include vertical diffusion barriers.

Figure 8A:
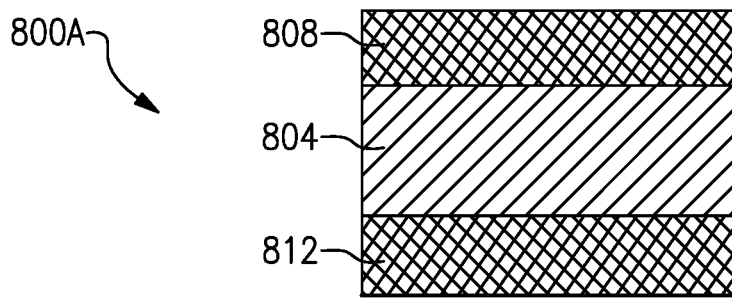
FIG. 8A illustrates a side view of a capacitor comprising a polar layer interposed between first and second conductive oxide electrode layers, according to embodiments.
Figure 8B:
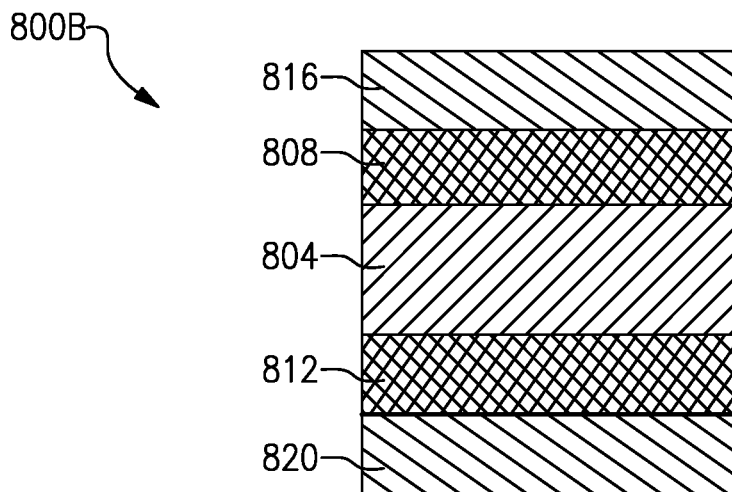
FIG. 8B illustrates a side view of a capacitor comprising a polar layer interposed between first and second conductive oxide electrode layers, and first and second barrier layers, according to embodiments.
Figure 8C:
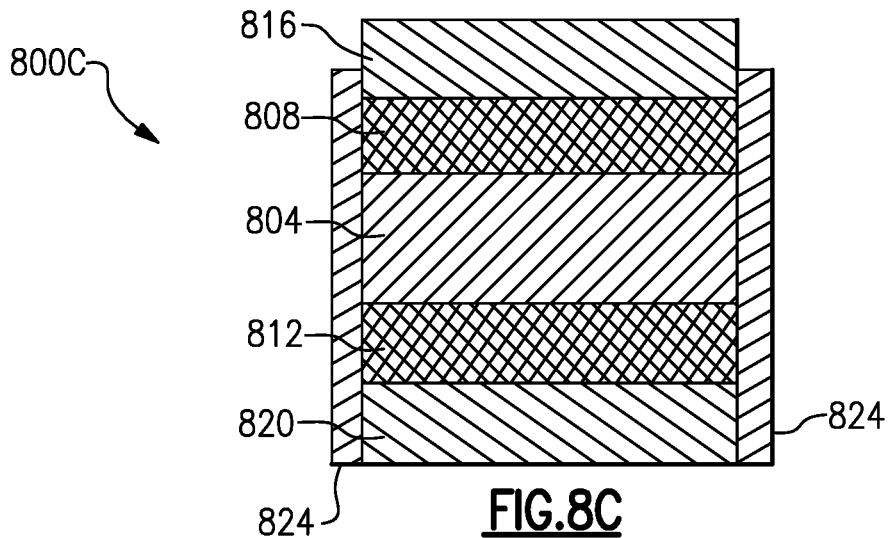
FIG. 8C illustrates a side view of a capacitor comprising a polar layer interposed between first and second conductive oxide electrode layers, first and second barrier layers, and sealant barrier layers formed on vertical sidewalls of the capacitor, according to embodiments.

FIGS. 8A, 8B and 8C schematically illustrates side views of capacitor stacks 800A, 800B and 800C, respectively, each comprising a storage layer 804 interposed between first and second conductive oxide electrode layers 808, 812, according to various embodiments. The storage layer 804, the upper or a first conductive oxide electrode layer 808 and the lower or a second conductive oxide electrode layer 812 can be configured according to various embodiments disclosed above, detailed descriptions of which are omitted for brevity. The storage layer 804 comprises a polar layer comprising an oxide layer that is deposited under an oxidizing environment and/or relatively high temperatures as described above.

Referring to the capacitor stack 800B, in some embodiments, one or both of the first and second conductive oxide electrode layers 808, 812 have formed thereon a upper and lower barrier layers 816, 820, respectively, on opposite sides of the storage layer 804. In various embodiments, one or both of the upper and lower barrier layers 816, 820 comprises a conductive barrier layer material such as a metal or an intermetallic compound, e.g., a refractory metal or a refractory intermetallic compound, that can suppress diffusion while providing high electrical conductivity.

In some embodiments, the upper and lower barrier layers 816, 820 include one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

In some embodiments, the upper and lower barrier layers 816, 820 include an intermetallic compound such as $Ti_3Al$, TiAl, $TiAl_3$, $Ni_3Al$, $NiAl_3$, NiAl, $Ni_2MnGa$, FeGa and $Fe_3Ga$. In some embodiments, the upper and lower barrier layers 816, 820 include $IrOx$, where x=0 to 2. Advantageously, as described above, $IrO_x$ may also serve the function of a further electrode with low electrical resistance. Thus, these embodiments can reduce the number of layers over the ferroelectric capacitor stack.

As described above, to maintain the device characteristics through fabrication and post fabrication usage, diffusion of atoms to and from the ferroelectric capacitor are suppressed using upper and lower barrier layers 816, 820, according to embodiments. In addition to suppressing the diffusion vertically, under similar integration schemes, horizontal diffusion of atoms to and from the ferroelectric capacitor may also need to be suppressed. For example, horizontal diffusion barriers according to embodiments may serve, e.g., to suppress hydrogen diffusion. Hydrogen is used many semiconductor backend processes for passivation of surfaces and interfaces during the final forming gas (H2/N2) annealing. However, hydrogen can substantially damage or even destroy ferroelectric properties of some ferroelectric capacitors. Thus, there is a need for effective sidewall barrier layers to suppress exposure of one or more layers of the ferroelectric capacitor to hydrogen during subsequent thermal steps.

Referring to the capacitor stack 800C, in some embodiments, the capacitor stacks 800A or 800B may have formed thereon a barrier sealant layer 824 on one or both side surfaces of one or more of the storage layer 104, the first oxide electrode layer 808, the second conductive oxide electrode layer 812, the upper barrier layer 816 and the lower barrier layer 820. Unlike the upper and lower barrier layers 816, 820, the barrier sealant layer(s) 824 is electrically insulating to prevent an electrical short across the first and second oxide electrode layers 808, 812. In some embodiments, the barrier sealant layer(s) 824 comprises a metal oxide, e.g., a Mg-containing oxide or an Al-containing oxide. The metal oxide may include, e.g., one or more of MgO, TiAlO and LaAlO. In some embodiments, the barrier sealant layer(s) 824 is a conformally deposited layer and/or is formed as a spacer structure by isotropic etching after depositing.

Alternative barrier sealant layers 824 are possible. For example, in some embodiments, one or both of the barrier layers 824 comprise sidewalls of one or more of the first and second conductive oxide electrode layers 808, 812 and the storage layer 804 that are formed by oxidation, fluorination and/or chlorination.

Alternative Polar Layers and Configurations

In the above, various compositions of the storage layer have been described. Alternative arrangements are possible.

Some materials, referred to as paraelectric materials, display a nonlinear polarization as a function of applied electric field, similar to ferroelectric materials described above. However, unlike ferroelectric materials, paraelectric materials do not display a remnant polarization when the electric field is removed. In some embodiments, a paraelectric oxide layer is included in the capacitor stack in lieu of or in addition to a ferroelectric oxide layer. The resulting capacitor can be used, e.g., for volatile memory applications.

In these embodiments, a capacitor arranged similarly to the capacitors 800A, 800B and 800C (FIGS. 8A-8C) comprises a crystalline polar layer comprising a base ferroelectric material substitutionally doped with a dopant. The base ferroelectric material comprises one or more metal elements and one or both of oxygen or nitrogen. The dopant comprises a metal element different from the one or more metal elements, wherein the dopant is present at a concentration such that a remnant polarization of the base ferroelectric material initially greater than about 5 $\mu C/cm^2$ to about zero. In some embodiments, a capacitor is arranged similarly to the capacitors 800A, 800B and 800C (FIGS. 8A-8C), except that one or more of the storage layer 804, the first conductive oxide electrode layer 808 and second conductive oxide electrode layer 812 have a non-uniform composition, e.g., a graded composition that increases or decreases in one or the other of vertical directions from any point within the thickness.

Memory Cell Including Ferroelectric Capacitor

Figure 9:
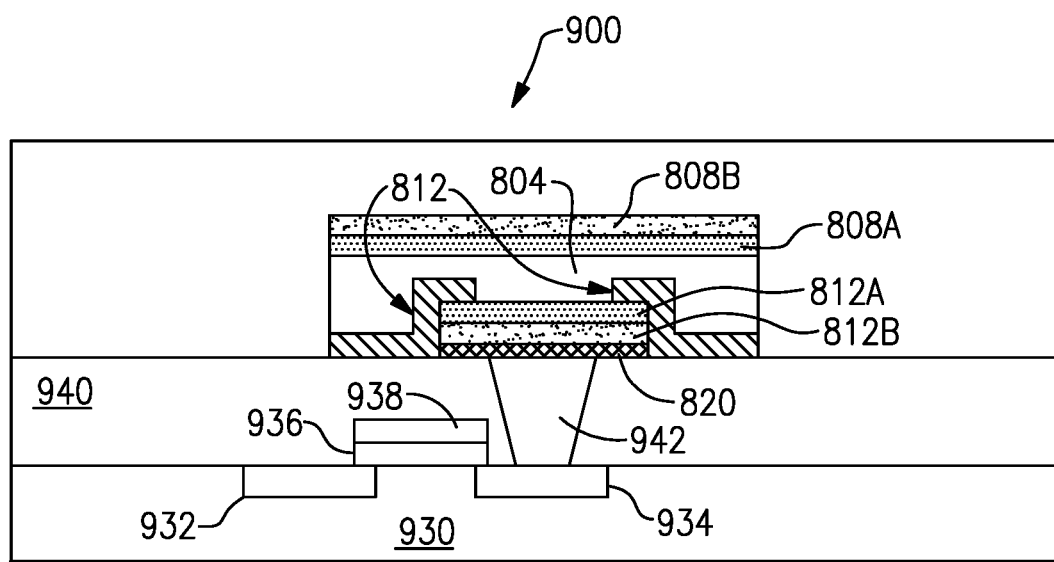
FIG. 9 illustrates a cross-sectional view of a memory device comprising a transistor coupled to a capacitor comprising a polar layer interposed between first and second conductive oxide electrodes, according to embodiments.

FIG. 9 illustrates a cross-sectional view of an example FeRAM cell 900 that can be implemented with various capacitor configurations described above, according to embodiments. The FeRAM cell 900 includes an access or a select metal oxide semiconductor (MOS) transistor including a gate dielectric 936 and a gate electrode 938 formed over a channel region between a source 932 and a drain 934. Power or sensing circuitry (not shown) may be electrically connected to the source 932 and/or drain 934, and gated by the gate electrode 938. The transistor is covered with a first-level dielectric layer 940, e.g., $SiO_2$. A drain contact 942, e.g., a silicon plug, may be formed to contact the drain 934 to electrically connect the transistor to a ferroelectric capacitor.

A ferroelectric capacitor may be formed over the drain contact 942. The capacitor comprises a storage layer 804 interposed between a first/top electrode (stack) 808A/808B and a second/bottom electrode (stack) 812A/812B, according to various embodiments. As described above, one or both of the first/top electrode layer 808A/808B and the second/bottom electrode 812A/812B can include more than one layer. For example, the first electrode 808A/808B may include a first conductive oxide 808A, which can have a crystal structure matching that of the storage layer 804, and a further electrode 808B comprising a binary conductive metal oxide. Similarly, the second electrode 812A/812B may include a second conductive oxide 812A, which can have a crystal structure matching that of the storage layer 804, and a further electrode 812B comprising a binary conductive metal oxide. The second electrode 812A/812B of the ferroelectric capacitor is electrically connected to the drain 934 of the transistor through the drain contact 942.

Still referring to FIG. 9, as described above with respect to FIG. 8B, a lower barrier layer 820 may be formed between the second electrode 812A/812B to serve as a diffusion barrier to suppress undesirable diffusion therethrough to and from any of the layers of the capacitor thereover including, e.g., oxygen diffusion into the drain contact 942 during the deposition and/or a post-anneal of the storage layer 804. Similarly, while not shown, an upper barrier layer may be formed on the first electrode 808A/808B to suppress diffusion therethrough. The diffusion barrier layers can have any of the compositions and configurations described above, e.g., with respect to FIG. 8B.

Still referring to FIG. 9, the ferroelectric capacitor may further have formed thereon one or more barrier sealant layer to suppress lateral diffusion. For example, in FIG. 9, remaining portions 812 of a sacrificial barrier layer are also shown. The sacrificial barrier may be formed as a blanket layer prior to depositing the storage layer 804, to suppress diffusion of atoms to and from the storage layer 804 as it is being deposited, or during a post-deposition anneal. The sacrificial barrier layer is subsequently removed to expose the underlying second electrode 812A/812B and to expose the first-level dielectric layer 940, thereby resulting in the illustrated remaining portions 812 of the sacrificial layer. The remaining portions 812 serve as a permanent barrier sealant layer for suppressing lateral diffusion to and from and/or through the second electrode 812A/812B. In addition, while not shown, a further a barrier sealant layer may be formed on one or both sidewall surfaces of the ferroelectric capacitor to cover side surface(s) of the storage layer 804 and/or the first electrode 808A. Each of the barrier sealant layers can have any of the compositions and configurations described above, e.g., with respect to FIG. 8C.

While not shown, a plurality transistors and capacitors may be configured to form a memory array. Each of the transistor gates 938, sources 932 and the top electrode 808A/808B of the capacitors may be individually contacted and separately controlled through metallization levels (not shown) to enable writing, non-volatile storage, and reading of the ferroelectric memory cell.

In operation, writing in the FeRAM cell 900 may be accomplished by applying a field across the storage layer 804 of the cell capacitor, thereby inducing a ferroelectric transition as described above with respect to, e.g., FIGS. 1B and 1C. For example, when the storage layer 804 comprises a perovskite oxide, the field may induce some metal atoms into an "up" or a "down" orientation (depending on the polarity of the charge), thereby storing a logical "1" or "0". In some embodiments, a reading operation may be accomplished by forcing the cell capacitor, using the access transistor, into a particular state, e.g., a "0" state. If the cell capacitor already held a "0" state, relatively low or no detectable current may flow through the output lines. On the other hand, if the cell held a "1" state, the metal atoms may be re-oriented, which may be accompanied by a pulse of current in the output as they push electrons out of the metal having the "down" side. The presence of this pulse can indicate that the cell held a "1". Since this process overwrites the cell, reading the FeRAM cell 1200 may be a destructive process, and the cell may be re-written if it was changed.

Figure 10:
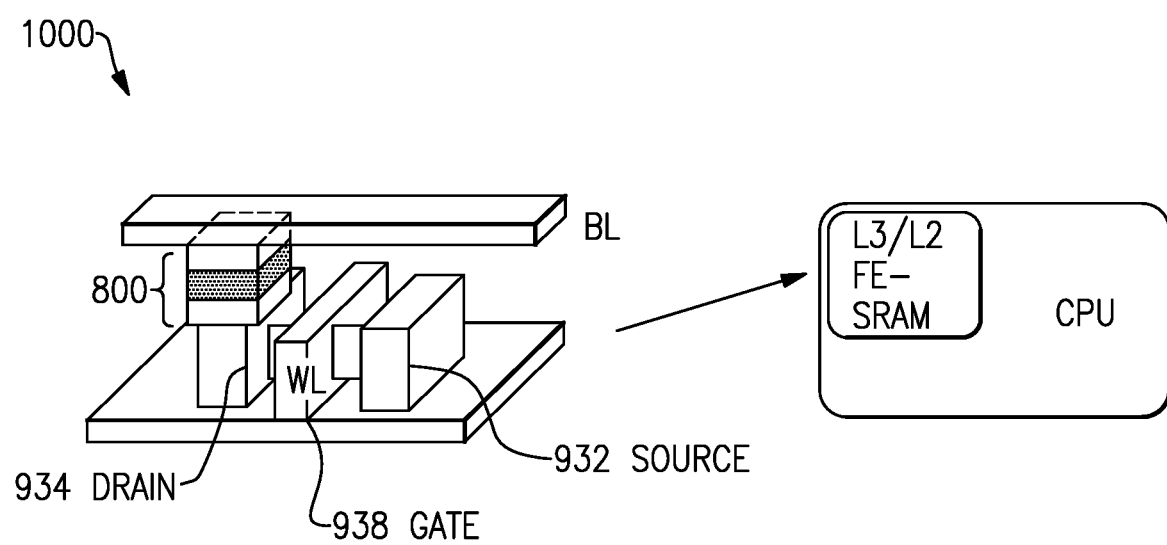
FIG. 10 illustrates an perspective view of a memory device comprising a finFET transistor coupled to a capacitor comprising a polar layer interposed between first and second conductive oxide electrodes, according to embodiments.

FIG. 10 illustrates a perspective view of a semiconductor device comprising a FeRAM cell 1000 according to embodiments. The FeRAM cell 1000 is similar to the FeRAM cell 900 (FIG. 9) and includes a ferroelectric capacitor 800 integrated in the back end of the line (interconnect/metallization levels), except, the transistor in the front end of the line is implemented as a fin field effect transistor (FinFET) for advanced technology nodes, e.g., sub 100 nm nodes. The FinFET transistor comprises a fin-shaped channel extending horizontally between a source 932 and a drain 934, and a gate 938 electrode that wraps top and side surfaces of the fin-shaped channel. The gate 938 can be electrically connected to a word line and the drain 934 can be electrically connected to a bit line through the ferroelectric capacitor 800.

The FeRAM cells 900 (FIG. 9) and 1000 (FIG. 10) may be electrically connected to an integrated processor (CPU) and integrated in addition to or at least partially in lieu of SRAM and/or DRAM cells to form L2 and/or L3 cache memory in the illustrated example computing architecture.

ADDITIONAL EXAMPLES

1. A semiconductor device, comprising:
   a capacitor comprising:
   a polar layer comprising a base polar material doped with a dopant, wherein the base polar material includes one or more metal elements and one or both of oxygen or nitrogen, and wherein the dopant comprises a metal element that is different from the one or more metal elements and is present at a concentration such that a ferroelectric switching voltage of the capacitor is different from that of the capacitor having the base polar material without being doped with the dopant by more than about 100 mV,
   first and second crystalline conductive oxide electrodes on opposing sides of the polar layer, and
   first and second barrier metal layers on respective ones of the first and second crystalline conductive oxide electrodes on opposing sides of the polar layer.

2. The semiconductor device of Embodiment 1, wherein the base polar material comprises a base ferroelectric material, and wherein increasing the concentration of the dopant decreases the ferroelectric switching voltage.

3. The semiconductor device of Embodiment 2, wherein the ferroelectric switching voltage is lower than about 1200 mV.

4. The semiconductor device of Embodiment 1, wherein a remnant polarization of the polar layer is different than that of the base polar material without the dopant by more than about 5 $\mu C/cm^2$.

5. The semiconductor device of Embodiment 2, wherein the polar layer has a perovskite crystal structure and comprises a ferroelectric oxide having a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.

6. The semiconductor device of Embodiment 2, wherein the polar layer comprises a ferroelectric oxide selected from the group consisting of $BaTiO_3$, $PbTiO_3$, $KNbO_3$, $NaTaO3$, $BiFeO_3$ and $PbZrTiO_3$.

7. The semiconductor device of Embodiment 2, wherein the polar layer comprises a ferroelectric oxide selected from the group consisting of $Pb(Mg,Nb)O_3$, $Pb(Mg,Nb)O_3$—$PbTiO_3$, $PbLaZfTiO_3$, $Pb(Sc,Nb)O_3$, $BaTiO_3$—$Bi(Zn(Nb,Ta))O_3$, $BaTiO_3$—$BaSrTiO_3$, $Bi_{1-x}La_xFeO_3$, $Bi_{1-x}Ce_xFeO_3$ and $BiFe_{1-y}Co_yO_3$.

8. The semiconductor device of Embodiment 2, wherein the polar layer comprises a ferroelectric oxide selected from the group consisting of $LiNbO_3$, $LiTaO_3$, LiFeTaOF, SrBaNbO, BaNaNbO, KNaSrBaNbO.

9. The semiconductor device of Embodiment 2, wherein the dopant comprises a lanthanide element or niobium.

10. The semiconductor device of Embodiment 2, wherein the base ferroelectric material has a hexagonal crystal structure, wherein the base ferroelectric material comprises $LuFeO_3$ or has a chemical formula represented by $RMnO_3$, and wherein R is a rare earth element.

11. The semiconductor device of Embodiment 2, wherein the base ferroelectric material comprises a superlattice comprising a first layer alternating with a second layer different from the first layer, wherein the first layer has a chemical formula represented by $ABO_3$ and the second layer has a chemical formula represented by $CDO_3$, wherein A and B are different metal elements and C and D are different metal elements, and wherein each of C and D are different from one or both of A and B.

12. The semiconductor device of Embodiment 11, wherein the first layer comprises $SrTiO_3$, and wherein the second layer comprises one or both of $PbTiO_3$ and $LaAlO_3$.

13. The semiconductor device of Embodiment 2, wherein the polar layer is ferroelectric and has a remnant polarization greater than about 10 $\mu C/cm^2$.

14. The semiconductor device of Embodiment 1, wherein the polar layer has a thickness less than about 50 nm.

15. The semiconductor device of Embodiment 2, wherein the dopant is present at a concentration such that the polar layer is paraelectric and has substantially zero remnant polarization.

16. The semiconductor device of Embodiment 1, wherein the base polar material comprises a dielectric material comprising one or more of Hf, Zr, Al, Si or Ga, wherein the dopant increases the ferroelectricity such that the polar layer has a remnant polarization greater than about 10 $\mu C/cm^2$.

17. The semiconductor device of Embodiment 1, wherein one or both of the first and second metal layers comprises a refractory metal serving as a diffusion barrier.

18. The semiconductor device of Embodiment 1, further comprising a transistor, wherein the capacitor is electrically connected to a drain of the transistor.

19. The semiconductor device of Embodiment 18, wherein the polar layer has the remnant polarization that is persistent for at least one day, such that the semiconductor device is a nonvolatile memory device.

20. A semiconductor device, comprising:
    a capacitor comprising:
    a polar layer comprising a base polar material doped with a dopant, wherein the base polar material includes one or more metal elements and one or both of oxygen or nitrogen, and wherein the dopant comprises a metal element of one of 4d series, 5d series, 4f series or 5f series that is different from the one or more metal elements, wherein the dopant is present at a concentration such that a remnant polarization of the polar layer is different than that of the base polar material without the dopant, and
    first and second crystalline conductive oxide electrodes on opposing sides of the polar layer; and
    first and second barrier metal layers on respective ones of the first and second crystalline conductive oxide electrodes on opposing sides of the polar layer.

21. The semiconductor device of Embodiment 20, wherein the remnant polarization of the polar layer is different from that of the base polar material without the dopant by more than about 5 $\mu C/cm^2$.

22. The semiconductor device of Embodiment 20, wherein a ferroelectric switching voltage of the capacitor is different from that of the capacitor having the base polar material without being doped with the dopant by more than about 100 mV.

23. The semiconductor device of Embodiment 22, wherein the ferroelectric switching voltage is lower than about 1200 mV.

24. The semiconductor device of Embodiment 20, wherein the polar layer has one of a perovskite structure or hexagonal crystal structure.

25. The semiconductor device of Embodiment 24, wherein the dopant comprises a lanthanide element or niobium.

26. The semiconductor device of Embodiment 20, wherein the polar layer has a lattice constant that is matched within about 20% of a lattice constant of one or both of the first and second crystalline conductive oxide electrodes.

27. A semiconductor device, comprising:
    a capacitor comprising:
        a polar layer comprising a base polar material doped with a dopant, wherein the base polar material includes one or more metal elements and one or both of oxygen or nitrogen, wherein the dopant comprises a metal element that is different from the one or more metal elements and is present at a concentration such that a remnant polarization of the polar layer is different from that of the base polar material without the dopant by more than about 5 µC/cm$^2$,
        first and second crystalline conductive oxide electrodes on opposing sides of the polar layer, and
        first and second barrier metal layers on respective ones of the first and second crystalline conductive oxide electrodes on opposing sides of the polar layer.

28. The semiconductor device of Embodiment 27, wherein the base polar material comprises a base ferroelectric material, and wherein increasing the concentration of the dopant decreases the remnant polarization of the base ferroelectric material.

29. The semiconductor device of Embodiment 27, wherein a ferroelectric switching voltage of the capacitor is different from that of the capacitor having the base polar material without being doped with the dopant by more than about 100 mV.

30. The semiconductor device of Embodiment 29, wherein the ferroelectric switching voltage is lower than about 1200 mV.

31. A capacitor, comprising:
    a crystalline polar layer comprising a base polar material substitutionally doped with a dopant;
    the base polar material comprising one or more metal elements and one or both of oxygen or nitrogen; and
    the dopant comprising a metal element of one of 4d series, 5d series, 4f series or 5f series that is different from the one or more metal elements, such that a ferroelectric switching voltage of the capacitor is different from that of the capacitor having the base polar material without being doped with the dopant by more than about 100 mV.

32. The capacitor of Embodiment 31, wherein the base polar material comprises a base ferroelectric material, and wherein increasing the concentration of the dopant decreases the ferroelectric switching voltage.

33. The capacitor of Embodiment 32, wherein the ferroelectric switching voltage is lower than about 1200 mV.

34. The capacitor of Embodiment 31, wherein the base polar material comprises a base ferroelectric material, and wherein increasing the concentration of the dopant decreases the remnant polarization of the base ferroelectric material.

35. The capacitor of Embodiment 32, wherein the polar layer has a perovskite crystal structure and comprises a ferroelectric oxide having a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.

36. The capacitor of Embodiment 32, wherein the polar layer comprises a ferroelectric oxide selected from the group consisting of $BaTiO_3$, $PbTiO_3$, $KNbO_3$, $NaTaO_3$, $BiFeO_3$ and $PbZrTiO_3$.

37. The capacitor of Embodiment 32, wherein the polar layer comprises a ferroelectric oxide selected from the group consisting of $Pb(Mg,Nb)O_3$, $Pb(Mg,Nb)O_3$—$PbTiO_3$, $PbLaZfTiO_3$, $Pb(Sc,Nb)O_3$. $BaTiO_3$—$Bi(Zn(Nb,Ta))O_3$ and $BaTiO_3$—$BaSrTiO_3$, $Bi_{1-x}La_xFeO_3$, $Bi_{1-x}Ce_xFeO_3$ and $BiFe_{1-y}Co_yO_3$.

38. The capacitor of Embodiment 32, wherein the polar layer comprises a ferroelectric oxide selected from the group consisting of $LiNbO_3$, $LiTaO_3$, $LiFeTaOF$, SrBaNbO, BaNaNbO, KNaSrBaNbO.

39. The capacitor of Embodiment 38, wherein the dopant comprises a lanthanide element or niobium.

40. The capacitor of Embodiment 32, wherein the base ferroelectric material has a hexagonal crystal structure, wherein the base ferroelectric material comprises $LuFeO_3$ or has a chemical formula represented by $RMnO_3$, and wherein R is a rare earth element.

41. The capacitor of Embodiment 32, wherein the base ferroelectric material comprises a superlattice comprising a first layer alternating with a second layer different from the first layer, wherein the first layer has a chemical formula represented by $ABO_3$ and the second layer has a chemical formula represented by $CDO_3$, wherein A and B are different metal elements and C and D are different metal elements, and wherein each of C and D are different from one or both of A and B.

42. The capacitor of Embodiment 41, wherein the first layer comprises $SrTiO_3$, and wherein the second layer comprises one or both of $PbTiO_3$ and $LaAlO_3$.

43. The capacitor of Embodiment 32, wherein the dopant is present at a concentration such that the polar layer is paraelectric having substantially zero remnant polarization.

44. The capacitor of Embodiment 31, wherein the base polar material comprises a dielectric material, wherein the dopant increases the ferroelectricity of the dielectric material such that the polar layer has a remnant polarization greater than about 10 µC/cm$^2$.

45. The capacitor of Embodiment 44, wherein the dielectric material comprises one or more of an oxide of Hf, Zr, Al, Si or a mixture thereof.

46. The capacitor of Embodiment 44, wherein the dielectric material has a chemical formula represented by $Hf_{1-x}E_xO_y$, wherein each of x and y is greater than zero, and wherein E is selected from the group consisting of Al, Ca, Ce, Dy, Er, Gd, Ge, La, Sc, Si, Sr, Sn or Y.

47. The capacitor of Embodiment 44, wherein the dielectric material has a chemical formula represented by $Al_{1-x}R_xN$, $Ga_{1-x}R_xN$ or $Al_{1-x-y}Mg_xNb_yN$, wherein each of x and y is greater than zero, and wherein R is selected from the group consisting of Al, Ca, Ce, Dy, Er, Gd, Ge, La, Sc, Si, Sr, Sn or Y.

48. The capacitor of Embodiment 31, wherein the base polar material comprises a base paraelectric material, and wherein increasing the concentration of the dopant increases the remnant polarization of the base paraelectric material.

49. The capacitor of Embodiment 31, wherein the concentration of the dopant is graded in a layer normal direction of the polar layer.

50. A capacitor, comprising:
a crystalline polar layer comprising a base polar material substitutionally doped with a dopant;
the base polar material comprising a base metal oxide having a chemical formula $ABO_3$, wherein each of A and B represents one or more metal elements occupying interchangeable atomic positions of a crystal structure of the base polar material;
the dopant comprising a metal element of one of 4d series, 5d series, 4f series or 5f series that different from the one or more metal elements of the base polar material; and
first and second crystalline conductive oxide electrodes on opposing sides of the polar layer,
wherein the crystalline polar layer has one of a perovskite structure, a hexagonal crystal structure or a superlattice structure.

51. The capacitor of Embodiment 50, wherein the base polar material comprises a base ferroelectric material, and wherein increasing the concentration of the dopant decreases the remnant polarization of the base ferroelectric material.

52. The capacitor of Embodiment 50, wherein a remnant polarization of the polar layer is different than that of the base polar material without the dopant by more than about 5 $\mu C/cm^2$.

53. The capacitor of Embodiment 50, wherein a ferroelectric switching voltage of the capacitor is different from that of the capacitor having the base polar material without being doped with the dopant by more than about 100 mV.

54. The capacitor of Embodiment 53, wherein the ferroelectric switching voltage is lower than about 1200 mV.

55. The capacitor of Embodiment 50, wherein the base metal oxide comprises a base ferroelectric metal oxide, and wherein increasing the concentration of the dopant decreases the remnant polarization of the base ferroelectric metal oxide.

56. The capacitor of Embodiment 55, wherein the dopant comprises a lanthanide element or niobium.

57. The capacitor of Embodiment 56, wherein the dopant is present at a concentration greater than 0 percent and less than 25 percent, and wherein the polar layer undergoes a ferroelectric transition at a voltage lower than about 1200 mV.

58. The capacitor of Embodiment 50, wherein the polar layer is a single crystal layer.

59. The capacitor of Embodiment 51, wherein the polar layer terminates with a metal occupying a body center position of the perovskite structure at one or both interfaces formed with one or both of the first and second conductive oxide electrodes.

60. The capacitor of Embodiment 51, wherein the polar layer terminates with a metal occupying corner positions of the perovskite structure at one or both interfaces formed with one or both of the first and second conductive oxide electrodes.

61. A capacitor, comprising:
a crystalline polar layer comprising a base polar material substitutionally doped with a dopant;
the base polar material comprising one or more metal elements and one or both of oxygen or nitrogen; and
the dopant comprising a metal element of one of 4d series, 5d series, 4f series or 5f series that is different from the one or more metal elements, wherein the dopant is present at a concentration such that a remnant polarization of the polar layer is different than that of the base polar material without the dopant by more than about 5 $\mu C/cm^2$.

62. The capacitor of Embodiment 61, wherein a ferroelectric switching voltage of the capacitor is different from that of the capacitor having the base polar material without being doped with the dopant by more than about 100 mV.

63. The capacitor of Embodiment 61, wherein the ferroelectric switching voltage is lower than about 1200 mV.

64. The capacitor of Embodiment 61, wherein the base metal oxide comprises a base ferroelectric metal oxide, and wherein increasing the concentration of the dopant decreases the remnant polarization of the base ferroelectric metal oxide.

65. The capacitor of Embodiment 61, wherein the crystalline polar layer has one of a perovskite structure, a hexagonal crystal structure or a superlattice structure.

66. A semiconductor device, comprising:
a capacitor comprising:
a polar layer comprising a crystalline base polar material doped with a dopant, wherein the base polar material includes one or more metal elements and one or both of oxygen or nitrogen, wherein the dopant comprises a metal element that is different from the one or more metal elements and is present at a concentration such that a ferroelectric switching voltage of the capacitor is different from that of the capacitor having the base polar material without being doped with the dopant by more than about 100 mV, and
first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes,
wherein the first crystalline conductive or semiconductive oxide electrode serves as a template for growing the polar layer thereon, such that at least a portion of the polar layer is pseudomorphically formed on the first crystalline conductive or semiconductive oxide electrode.

67. The semiconductor device of Embodiment 66, wherein a ferroelectric switching voltage of the capacitor is different from that of the capacitor having the base polar material without being doped with the dopant by more than about 100 mV.

68. The semiconductor device of Embodiment 67, wherein the ferroelectric switching voltage is lower than about 1200 mV.

69. The semiconductor device of Embodiment 66, wherein one or both of the first and second crystalline conductive or semiconductive oxide electrodes have a thickness between about 1 nm and 5 nm.

70. The semiconductor device of Embodiment 67, wherein one or both of the first and second crystalline conductive or semiconductive oxide electrodes have an electrical resistivity lower than 0.01 Ohms-cm.

71. The semiconductor device of Embodiment 66, wherein the polar layer and one or both of the first and second crystalline conductive or semiconductive oxide electrodes have the same crystal structure.

72. The semiconductor device of Embodiment 71, wherein the dopant comprises a lanthanide element or niobium.

73. The semiconductor device of Embodiment 72, wherein the polar layer comprises a region having a lateral dimension between about 10 nm and 500 nm in which one or both of the first and second crystalline conductive or semiconductive oxide electrodes are pseudomorphic thereon.

74. The semiconductor device of Embodiment 71, wherein the same crystal structure is a perovskite structure, and wherein the polar layer comprises a ferroelectric oxide selected from the group consisting of $BaTiO_3$, $PbTiO_3$, $KNbO_3$, $NaTaO_3$, $BiFeO_3$ $PbZrTiO_3$, $Pb(Mg,Nb)O_3$, $Pb(Mg,Nb)O_3$—$PbTiO_3$, $PbLaZfTiO_3$, $Pb(Sc,Nb)O_3$. $BaTiO_3$—$Bi(Zn(Nb,Ta))O_3$, $BaTiO_3$—$BaSrTiO_3$, $LiNbO_3$, $LiTaO_3$, $LiFeTaOF$, $SrBaNbO$, $BaNaNbO$, $KNaSrBaNbO$, $Bi_{1-x}La_xFeO_3$, $Bi_{1-x}Ce_xFeO_3$ and $BiFe_{1-y}Co_yO_3$.

75. The semiconductor device of Embodiment 74, wherein one or both of the first and second crystalline conductive or semiconductive oxide electrodes comprise an oxide selected from the group consisting of $(La,Sr)CoO_3$, $SrRuO_3$, $(La,Sr)MnO_3$, $YBa_2Cu_3O_7$, $Bi_2Sr_2CaCu_2O_8$, $LaNiO_3$, $SrRuO_3$, $LaMnO_3$, $SrMnO_3$, $LaCoO_3$ or $SrCoO_3$.

76. The semiconductor device of Embodiment 75, wherein the polar layer directly contacts one or both of the first and second crystalline conductive or semiconductive oxide electrodes, and wherein the semiconductor device further comprises a further electrode formed on one or both of the first and second crystalline conductive or semiconductive oxide electrodes and comprising a conductive binary metallic oxide selected from the group consisting of an iridium (Ir) oxide, a ruthenium (Ru) oxide, a palladium (Pd) oxide, an osmium (Os) oxide or a rhenium (Re) oxide.

77. The semiconductor device of Embodiment 71, wherein the same crystal structure is a hexagonal crystal structure, wherein the polar layer comprises $LuFeO_3$ or has a chemical formula represented by $RMnO_3$, and wherein R is a rare earth element.

78. The semiconductor device of Embodiment 66, wherein one or both of the first and second crystalline conductive or semiconductive oxide electrodes have one of a hexagonal structure, a delaffosite structure, a spinel structure or a cubic structure.

79. The semiconductor device of Embodiment 78, wherein one or both of the first and second crystalline conductive or semiconductive oxide electrodes comprise one or more of $PtCoO_2$, $PdCoO_2$, Al-doped ZnO, $Fe_3O_4$, $LiV_2O_4$ or Sn-doped $In_2O_3$.

80. The semiconductor device of Embodiment 66, further comprising a transistor, wherein the capacitor is electrically connected to a drain of the transistor.

81. A semiconductor device, comprising:
a capacitor stack comprising:
a crystalline polar layer comprising a base polar material substitutionally doped with a dopant;
the base polar material comprising a metal oxide having one of a perovskite structure or a hexagonal crystal structure;
the dopant comprising a metal of one of 4d series, 5d series, 4f series or 5f series that is different from metal(s) of the metal oxide; and
first and second crystalline conductive or semiconductive oxide electrodes on opposing sides of the crystalline polar layer, wherein the crystalline polar layer has the same crystal structure as one or both of the first and second crystalline conductive or semiconductive oxide electrodes.

82. The semiconductor device of Embodiment 81, wherein the crystalline polar layer has a lattice constant that is matched within about 20% of a lattice constant of one or both of the first and second crystalline conductive oxide electrodes.

83. The semiconductor device of Embodiment 82, wherein the same crystal structure is a perovskite crystal structure and the polar layer comprises a ferroelectric oxide having a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.

84. The semiconductor device of Embodiment 83, wherein one or both of the first and second crystalline conductive oxide electrodes comprises an oxide having a chemical formula represented by $C_{(p-u)}C'_uD_{(q-v)}D'_vO_w$, wherein C and C' occupy interchangeable atomic positions in the perovskite crystal structure, wherein D and D' occupy interchangeable atomic positions in the perovskite crystal structure, wherein p, q and w are integers, and wherein one or both of u and v are greater than zero.

85. The semiconductor device of Embodiment 84, wherein the polar layer comprises a ferroelectric oxide having a perovskite structure selected from the group consisting of $BaTiO_3$, $PbTiO_3$, $KNbO_3$, $NaTaO_3$, $BiFeO_3$ $PbZrTiO_3$, $Pb(Mg,Nb)O_3$, $Pb(Mg,Nb)O_3$—$PbTiO_3$, $PbLaZrTiO_3$, $Pb(Sc,Nb)O_3$. $BaTiO_3$—$Bi(Zn(Nb,Ta))O_3$, $BaTiO_3$—$BaSrTiO_3$, $LiNbO_3$, $LiTaO_3$, $LiFeTaOF$, $SrBaNbO$, $BaNaNbO$, $KNaSrBaNbO$, $Bi_{1-x}La_xFeO_3$, $Bi_{1-x}Ce_xFeO_3$ and $BiFe_{1-y}Co_yO_3$.

86. The semiconductor device of Embodiment 85, wherein one or both of the first and second crystalline conductive or semiconductive oxide electrodes comprise an oxide selected from the group consisting of $(La,Sr)CoO_3$, $SrRuO_3$, $(La,Sr)MnO_3$, $YBa_2Cu_3O_7$, $Bi_2Sr_2CaCu_2O_8$, $LaNiO_3$, $SrRuO_3$, $LaMnO_3$, $SrMnO_3$, $LaCoO_3$ or $SiCoO_3$.

87. The semiconductor device of Embodiment 86, wherein the polar layer directly contacts one or both of the first and second crystalline conductive or semiconductive oxide electrodes, and wherein the semiconductor device further comprises a further electrode formed on one or both of first and second crystalline conductive or semiconductive oxide electrodes and comprising a conductive binary metallic oxide selected from the group consisting of an iridium (Ir) oxide, a ruthenium (Ru) oxide, a palladium (Pd) oxide, an osmium (Os) oxide or a rhenium (Re) oxide.

88. The semiconductor device of Embodiment 82, wherein the same crystal structure is a hexagonal crystal structure, wherein the polar layer comprises $LuFeO_3$ or has a chemical formula represented by $RMnO_3$, and wherein R is a rare earth element.

89. The semiconductor device of Embodiment 82, further comprising a transistor, wherein the capacitor is electrically connected to a drain of the transistor.

90. The semiconductor device of Embodiment 89, wherein the polar layer has the remnant polarization that is persistent for at least one day, such that the semiconductor device is a nonvolatile memory device.

91. A semiconductor device, comprising:
a capacitor comprising:
a polar layer comprising a crystalline base polar material doped with a dopant, wherein the base polar material includes one or more metal elements and one or both of oxygen or nitrogen, wherein the dopant comprises a metal element that is different from the one or more metal elements and is present at a concentration such that a remnant polarization of the polar layer is different from that of the base polar material without the dopant by more than about 5 $\mu C/cm^2$, and
first and second crystalline conductive or semiconductive oxide electrodes on opposing sides of the polar layer, wherein the polar layer has a lattice constant that is matched within about 20% of a lattice constant of one or both of the first and second crystalline conductive or semiconductive oxide electrodes,
wherein the first crystalline conductive or semiconductive oxide electrode serves as a template for growing the polar layer thereon, such that at least a portion of the polar layer is coherently strained on the first crystalline conductive or semiconductive oxide electrode.

92. The semiconductor device of Embodiment 91, wherein the base polar material comprises a base ferroelectric material, and wherein increasing the concentration of the dopant decreases the remnant polarization of the base ferroelectric material.

93. The semiconductor device of Embodiment 91, wherein a ferroelectric switching voltage of the capacitor is different from that of the capacitor having the base polar material without being doped with the dopant by more than about 100 mV.

94. The semiconductor device of Embodiment 93, wherein the ferroelectric switching voltage is lower than about 1200 mV.

95. The semiconductor device of Embodiment 91, wherein one or both of the first and second crystalline conductive or semiconductive oxide electrodes comprise an oxide selected from the group consisting of $(La,Sr)CoO_3$, $SrRuO_3$, $(La,Sr)MnO_3$, $YBa_2Cu_3O_7$, $Bi_2Sr_2CaCu_2O_8$, $LaNiO_3$, SrRuO3, $LaMnO_3$, $SrMnO_3$, $LaCoO_3$ or $SrCoO_3$.

96. A semiconductor device, comprising:
a transistor formed on a silicon substrate; and
a capacitor electrically connected to the transistor by a conductive via, the capacitor comprising:
upper and lower conductive oxide electrodes on opposing sides of a polar layer, wherein the lower conductive oxide electrode is electrically connected to a drain of the transistor, and
a polar layer comprising a base polar material doped with a dopant, wherein the base polar material includes one or more metal elements and one or both of oxygen or nitrogen, wherein the dopant comprises a metal element that is different from the one or more metal elements and is present at a concentration such that a ferroelectric switching voltage of the capacitor is different from that of the capacitor having the base polar material without being doped with the dopant by more than about 100 mV; and
a lower barrier layer comprising a refractory metal or an intermetallic compound between the lower conductive oxide electrode and the conductive via.

97. The semiconductor device of Embodiment 96, wherein the polar layer comprises a metal oxide formed in an oxidizing environment at a temperature greater than 300° C.

98. The semiconductor device of Embodiment 96, further comprising an upper barrier layer comprising a refractory metal or an intermetallic compound over the upper conductive oxide electrode.

99. The semiconductor device of Embodiment 96, wherein one or both of the upper and lower barrier layers comprise one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

100. The semiconductor device of Embodiment 96, wherein one or both of the upper and lower barrier layers comprises one or more of $Ti_3Al$, TiAl, $TiAl_3$, $Ni_3Al$, $NiAl_3$ NiAl, $Ni_2MnGa$, FeGa and $Fe_3Ga$.

101. The semiconductor device of Embodiment 96, further comprising a barrier sealant layer formed on one or both side surfaces of one or more of the dielectric layer, the upper oxide electrode layer and the lower conductive oxide electrode layer.

102. The semiconductor device of Embodiment 96, wherein the barrier sealant layer comprises a metal oxide comprising Al or Mg.

103. The semiconductor device of Embodiment 96, wherein the polar layer comprises a ferroelectric oxide selected from the group consisting of $BaTiO_3$, $PbTiO_3$, $KNbO_3$, $NaTaO_3$, $BiFeO_3$ $PbZrTiO_3$, $Pb(Mg,Nb)O_3$, $Pb(Mg,Nb)O_3$—$PbTiO_3$, $PbLaZfTiO_3$, $Pb(Sc,Nb)O_3$. $BaTiO_3$—$Bi(Zn(Nb,Ta))O_3$, $BaTiO_3$—$BaSrTiO_3$, $LiNbO_3$, $LiTaO_3$, LiFeTaOF, SrBaNbO, BaNaNbO, KNaSrBaNbO, $Bi_{1-x}La_xFeO_3$, $Bi_{1-x}Ce_xFeO_3$ and $BiFe_{1-y}Co_yO_3$.

104. The semiconductor device of Embodiment 96, further comprising an insulating sealant layer contacting one of both side surfaces of one or more of the polar layer, the upper conductive oxide electrode and the lower conductive oxide electrode.

105. The semiconductor device of Embodiment 96, wherein the dopant comprises a lanthanide element or niobium.

106. The semiconductor device of Embodiment 96, wherein the base ferroelectric material has a hexagonal crystal structure, wherein the base ferroelectric material comprises $LuFeO_3$ or has a chemical formula represented by $RMnO_3$, and wherein R is a rare earth element.

107. A semiconductor device, comprising:
a transistor formed on a silicon substrate;
a capacitor electrically connected to the transistor by a conductive via, the capacitor comprising:
upper and lower conductive oxide electrodes on opposing sides of a polar layer, wherein the lower conductive oxide electrode is electrically connected to a drain of the transistor, and
the polar layer comprising a base polar material doped with a dopant, wherein the base polar material includes one or more metal elements and one or both of oxygen or nitrogen, and wherein the dopant comprises a metal element of one of 4d series, 5d series, 4f series or 5f series that is different from metal(s) of the metal oxide that is present at a concentration such that a remnant polarization of the polar layer is different than that of the base polar material without the dopant; and a barrier sealant layer formed on one or both side surfaces of one or more of the polar layer, the upper conductive oxide electrode layer and the lower conductive oxide electrode layer.

108. The semiconductor device of Embodiment 107, wherein the polar layer comprises a metal oxide formed in an oxidizing environment at a temperature greater than 500° C.

109. The semiconductor device of Embodiment 108, wherein the barrier sealant layer comprises a metal oxide.

110. The semiconductor device of Embodiment 109, wherein the barrier sealant layer comprises a metal oxide of Al or Mg.

111. The semiconductor device of Embodiment 110, wherein the barrier sealant layer comprises an oxide selected from the group consisting of MgO, TiAlO or LaAlO.

112. The semiconductor device of Embodiment 108, wherein the barrier sealant layer comprises oxidized, fluorinated and/or chlorinated portions of one or more of the upper and lower conductive oxide electrode layers and the polar layer.

113. The semiconductor device of Embodiment 108, further comprising one or both of a lower barrier layer between the lower conductive oxide electrode and the conductive via and an upper barrier layer over the upper conductive oxide electrode, wherein the one or both of the lower and upper barrier layers comprise a refractory metal or an intermetallic compound.

114. The semiconductor device of Embodiment 113, wherein one or both of the upper and lower barrier layers comprise one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

115. The semiconductor device of Embodiment 108, wherein the polar layer comprises a ferroelectric oxide selected from the group consisting of $BaTiO_3$, $PbTiO_3$, $KNbO_3$, $NaTaO_3$, $BiFeO_3$ and $PbZrTiO_3$.

116. The semiconductor device of Embodiment 108, further comprising an insulating sealant layer contacting one of both side surfaces of one or more of the polar layer, the upper conductive oxide electrode and the lower conductive oxide electrode.

117. The semiconductor device of Embodiment 108, wherein the polar layer comprises a ferroelectric oxide selected from the group consisting of $BaTiO_3$, $PbTiO_3$, $KNbO_3$, $NaTaO_3$, $BiFeO_3$ $PbZrTiO_3$, $Pb(Mg,Nb)O_3$, $Pb(Mg,Nb)O_3$–$PbTiO_3$, $PbLaZfTiO_3$, $Pb(Sc,Nb)O_3$. $BaTiO_3$—$Bi(Zn(Nb,Ta))O_3$, $BaTiO_3$—$BaSrTiO_3$, $LiNbO_3$, $LiTaO_3$, $LiFeTaOF$, $SrBaNbO$, $BaNaNbO$, $KNaSrBaNbO$, $Bi_{1-x}La_xFeO_3$, $Bi_{1-x}Ce_xFeO_3$ and $BiFe_{1-y}Co_yO_3$.

118. The semiconductor device of Embodiment 108, wherein the dopant comprises a lanthanide element or niobium.

119. The semiconductor device of Embodiment 108, wherein the base ferroelectric material has a hexagonal crystal structure, wherein the base ferroelectric material comprises $LuFeO_3$ or has a chemical formula represented by $RMnO_3$, and wherein R is a rare earth element.

120. The semiconductor device of Embodiment 108, wherein one or both of the upper and lower conductive oxide electrodes comprise an oxide selected from the group consisting of $(La,Sr)CoO_3$, $SrRuO_3$, $(La,Sr)MnO_3$, $YBa_2Cu_3O_7$, $Bi_2Sr_2CaCu_2O_8$, $LaNiO_3$, $SrRuO_3$, $LaMnO_3$, $SrMnO_3$, $LaCoO_3$ or $SrCoO_3$.

121. A semiconductor device, comprising:
a capacitor comprising a ferroelectric oxide layer interposed between first and second conductive oxide electrode layers, wherein the ferroelectric oxide layer comprises a base ferroelectric oxide that is doped with a dopant, wherein the dopant lowers a remnant polarization of the base ferroelectric oxide relative to an undoped base ferroelectric oxide by at least 5%.

122. A semiconductor device, comprising:
a ferroelectric oxide layer interposed between first and second conductive oxide electrode layers, wherein the ferroelectric oxide layer has a lattice constant that is matched within about 20% of a lattice constant of one or both of the first and second conductive oxide electrode layers.

123. A semiconductor device, comprising:
a capacitor comprising a ferroelectric oxide layer interposed between first and second conductive oxide electrode layers, wherein the ferroelectric oxide layer undergoes a ferroelectric transition at a voltage lower than about 600 mV.

124. A semiconductor device, comprising:
a capacitor comprising a ferroelectric oxide layer interposed between first and second conductive oxide electrode layers, wherein the ferroelectric oxide layer has a thickness less than about 50 nm.

125. A semiconductor device, comprising:
a ferroelectric oxide layer having a remnant polarization greater than about 10 $\mu C/cm^2$, wherein the ferroelectric oxide layer is doped with a lanthanide element at a concentration greater than about 5.0% on the basis of a total number of atomic sites of a metal of the ferroelectric oxide layer.

126. The semiconductor device of Embodiment 121, wherein the base ferroelectric oxide has a remnant polarization greater than about 10 $\mu C/cm^2$.

127. The semiconductor device of any one of Embodiments 121-126, wherein the ferroelectric oxide layer undergoes a ferroelectric phase transition at a voltage lower than about 200 mV.

128. The semiconductor device of any one of Embodiments 121-127, wherein the ferroelectric oxide layer has a thickness between about 2 nm and 200 nm.

129. The semiconductor device of any one of Embodiments 121-128, wherein the ferroelectric oxide layer has a crystal lattice structure that is the same as a crystal lattice structure of one or both of the first and second conductive oxide electrode layers.

130. The semiconductor device of any one of Embodiments 121-129, wherein the ferroelectric oxide layer has a lattice constant that is matched within about 10% of a lattice constant of one or both of the first and second conductive oxide electrode layers.

131. The semiconductor device of any one of Embodiments 121-130, wherein the ferroelectric oxide layer has a chemical formula represented by a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.

132. The semiconductor device of Embodiment 131, wherein the A' is an element of one of 4d series, 5d series, 4f series or 5f series.

133. The semiconductor device of any one of Embodiments 131 or 132, wherein the A' is a lanthanide element.

134. The semiconductor device of any one of Embodiments 131-133, wherein the dopant comprises La.

135. The semiconductor device of any one of Embodiments 131-134, wherein the amount of A' is between about 0.1 atomic % and 20 atomic % on the basis of the amount of A and A'.

136. The semiconductor device of any one of Embodiments 131-135, wherein B' is an element selected from the group consisting of Mn, Sc, Ti, V, Cr, Co, Ni, Cu and Zn.

137. The semiconductor device of any one of Embodiments 121-136, wherein one or both of the first and second crystalline conductive oxide electrodes comprises an oxide having a chemical formula represented by $C_{(p-u)}C'_uD_{(q-v)}D'_vO_w$, wherein C and C' occupy interchangeable atomic positions in the perovskite crystal structure, wherein D and D' occupy interchangeable atomic positions in the perovskite crystal structure, wherein p, q and w are integrers, and wherein one or both of u and v are greater than zero.

138. The semiconductor device of any one of Embodiments 121-137, wherein one or both of the first and second conductive oxide electrode layers have a thickness between about 1 nm and 5 nm.

139. The semiconductor device of any one of Embodiments 121-138, wherein one or both of the first and second conductive oxide electrode layers have a resistivity lower than 0.01 Ohms-cm.

140. The semiconductor device of any one of Embodiments 121-139, wherein one or both of the first and second conductive oxide electrode layers comprise one or more of an iridium (Ir) oxide, a ruthenium (Ru) oxide, a palladium (Pd) oxide, an osmium (Os) oxide, a rhenium (Re) oxide, $(La,Sr)CoO_3$, $SrRuO_3$, $(La,Sr)MnO_3$, $YBa_2Cu_3O_7$, $Bi_2Sr_2CaCu_2O_8$, $LaNiO_3$ and $SrTiO_3$.

141. The semiconductor device of any one of Embodiments 121-140, wherein the ferroelectric oxide layer has a region having a lateral dimension between about 10 nm and 500 nm in which one or both of the first and second conductive oxide electrode layers form pseudomorphic layers thereon.

142. The semiconductor device of any one of Embodiments 121-140, wherein the ferroelectric oxide layer has a perovskite structure.

143. The semiconductor device of Embodiment 142, wherein the base ferroelectric oxide comprises Bi.

144. The semiconductor device of Embodiments 142 or 143, wherein the base ferroelectric oxide comprises $BiFeO_3$.

145. The semiconductor device of any one of Embodiments 142-144, wherein the ferroelectric oxide layer comprises one of $Bi_{1-x}La_xFeO_3$, $Bi_{1-x}Ce_xFeO_3$ and $BiFe_{1-y}Co_yO_3$.

146. The semiconductor device of Embodiment 142, wherein the base ferroelectric oxide comprises Pb.

147. The semiconductor device of Embodiments 142 or 146, wherein the base ferroelectric oxide comprises $PbTiO_3$.

148. The semiconductor device of any one of Embodiments 142, 146 and 147, wherein the ferroelectric oxide layer comprises $PbTi_{1-y}Zr_yO_3$ or $PbTi_{1-y-z}Zr_yNb_zO_3$, wherein each of y and z is greater than zero.

149. The semiconductor device of any one of Embodiments 142-148, wherein one or both of the first and second conductive oxide electrode layers comprise one or more of $SrRuO_3$, $(La,Sr)MnO_3$ and Nb-doped $SrTiO_3$.

150. The semiconductor device of any one of Embodiments 142-149, wherein the ferroelectric oxide layer terminates with a metal occupying a body center position of the perovskite structure at one or both interfaces formed with one or both of the first and second conductive oxide electrode layers.

151. The semiconductor device of any one of Embodiments 142-149, wherein the ferroelectric oxide layer terminates with a metal occupying corner positions of the perovskite structure at one or both interfaces formed with one or both of the first and second conductive oxide electrode layers.

152. The semiconductor device of any one of Embodiments 141-141, wherein the ferroelectric oxide layer has a hexagonal structure.

153. The semiconductor device of Embodiment 152, wherein the base ferroelectric oxide comprises Mn.

154. The semiconductor device of Embodiments 152 or 153, wherein the base ferroelectric oxide comprises $AMnO_3$, wherein A is an element selected from the group consisting of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

155. The semiconductor device of any one of Embodiments 152-154, wherein one or both of the first and second conductive oxide electrode layers comprises $Ir_2O_3$ or $IrO_2$.

156. The semiconductor device of any one of Embodiments 121-141, wherein the ferroelectric oxide layer comprises an improper ferroelectric material in which a spontaneous polarization is accompanied by a structural phase transition.

157. The semiconductor device of Embodiment 156, wherein the base ferroelectric oxide layer comprises Lu.

158. The semiconductor device of Embodiments 156 or 157, wherein the base ferroelectric oxide comprises a superlattice comprising $SrTiO_3$ alternating with another oxide.

159. The semiconductor device of any one of Embodiments 156-158, wherein the base ferroelectric oxide comprises a superlattice comprising $SrTiO_3$ alternating with $PbTiO_3$.

160. The semiconductor device of any one of Embodiments 156-158, wherein the base ferroelectric oxide comprises a superlattice comprising $SrTiO_3$ alternating with $LaAlO_3$.

161. The semiconductor device of any one of Embodiments 121-160, wherein upon application of an electric field, the ferroelectric oxide layer energetically fluctuates between local minima of a double potential well separated by an energy barrier less than about 250 mV.

162. The semiconductor device of any one of Embodiments 121-161, wherein one or both of the first and second conductive oxide electrode layers have formed thereon a barrier layer formed on a side opposite the ferroelectric oxide layer.

163. The semiconductor device of Embodiment 162, wherein the barrier layer comprises a refractory metal or an intermetallic compound.

164. The semiconductor device of Embodiments 162 or 163, wherein the barrier layer comprises one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

165. The semiconductor device of any one of Embodiments 121-165, further comprising a side barrier layer contacting one of both side surfaces of one or more of the ferroelectric oxide layer, the first oxide electrode layer and the second conductive oxide electrode layer.

166. The semiconductor device of Embodiment 165, wherein the side barrier layer comprises a metal oxide.

167. The semiconductor device of Embodiments 165 or 166, wherein the side barrier layer comprises a metal oxide comprising Al or Mg.

168. The semiconductor device of any one of Embodiments 121-167, wherein a remnant polarization of the ferroelectric oxide layer is nonvolatile.

169. The semiconductor device of any one of Embodiments 121-168, wherein a remnant polarization of the ferroelectric oxide layer is volatile such that the ferroelectric oxide layer is paraelectric.

170. The semiconductor device of any one of Embodiments 121-169, wherein one or more of the ferroelectric oxide layer, the first oxide electrode layer and the second conductive oxide electrode layer have a graded composition in a vertical direction normal to a stacking direction.

171. The semiconductor device of any one of Embodiments 121-170, further comprising a transistor, wherein the capacitor is electrically connected to a drain of the transistor.

172. A composition of matter, comprising:
a ferroelectric oxide layer having a remnant polarization greater than about 10 $\mu C/cm^2$, wherein the ferroelectric oxide layer comprises a base ferroelectric oxide that is doped with a dopant comprising a lanthanide element at a concentration greater than about 5.0% % on the basis of a total number of atomic sites of a metal of the ferroelectric oxide layer.

173. The composition of Embodiment 172, wherein the ferroelectric oxide layer undergoes a ferroelectric phase transition at a voltage lower than about 200 mV.

174. The composition of Embodiments 172 or 173, wherein the ferroelectric oxide layer has a thickness between about 2 nm and 200 nm.

175. The composition of any one of Embodiments 172-174, wherein the ferroelectric oxide layer has a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.

176. The composition of Embodiment 175, wherein the A' is the lanthanide element.

177. The composition of Embodiment 176, wherein the A' is La.

178. The composition of any one of Embodiments 175-177, wherein the amount of A' is between about 0.1 atomic % and 20 atomic % on the basis of the amount of A.

179. The composition of any one of Embodiments 175-177, wherein B' is an element selected from the group consisting of Mn, Sc, Ti, V, Cr, Co, Ni, Cu and Zn.

180. The composition of any one of Embodiments 172-179, wherein the ferroelectric oxide layer has a perovskite structure.

181. The composition of Embodiment 180, wherein the base ferroelectric oxide comprises Bi.

182. The composition of Embodiments 180 or 181, wherein the base ferroelectric oxide comprises $BiFeO_3$.

183. The composition of any one of Embodiments 180-182, wherein the ferroelectric oxide layer comprises one of $Bi_{1-x}La_xFeO_3$, $Bi_{1-x}Ce_xFeO_3$ and $BiFe_{1-y}Co_yO_3$.

184. The composition of Embodiment 180, wherein the base ferroelectric oxide comprises Pb.

185. The composition of Embodiment 184, wherein the base ferroelectric oxide comprises $PbTiO_3$.

186. The composition of Embodiments 184 or 185, wherein the ferroelectric oxide layer comprises $PbTi_{1-y}Zr_yO_3$ or $PbTi_{1-y-z}Zr_yNb_zO_3$, wherein each of y and z is greater than zero.

187. The composition of any one of Embodiments 172-179, wherein the ferroelectric oxide layer has a hexagonal structure.

188. The composition of Embodiment 187, wherein the base ferroelectric oxide comprises Mn.

189. The composition of Embodiments 187 or 188, wherein the base ferroelectric oxide comprises $Yi_{1-x}Mn_xO_3$ 190. The composition of any one of Embodiments 172-179, wherein the ferroelectric oxide layer comprises an improper ferroelectric material in which a spontaneous polarization is accompanied by a structural phase transition.

191. The composition of Embodiment 190, wherein the base ferroelectric oxide layer comprises Lu.

192. The composition of Embodiments 190 or 191, wherein the base ferroelectric oxide comprises a superlattice comprising $SrTiO_3$ alternating with another oxide.

193. The composition of any one of Embodiments 190-192, wherein the base ferroelectric oxide comprises a superlattice comprising $SrTiO_3$ alternating with $PbTiO_3$.

194. The composition of any one of Embodiments 190-192, wherein the base ferroelectric oxide comprises a superlattice comprising $SrTiO_3$ alternating with $LaAlO_3$.

195. The composition of any one of Embodiments 172-194, wherein upon application of an electric field, the ferroelectric oxide layer energetically fluctuates between local minima of a double potential well separated by an energy barrier less than about 250 mV.

196. The composition of any one of Embodiments 172-195, wherein a remnant polarization of the ferroelectric oxide layer is nonvolatile.

197. The composition of any one of Embodiments 172-196, wherein a remnant polarization of the ferroelectric oxide layer is volatile such that the ferroelectric oxide layer is paraelectric.
198. The semiconductor device of Embodiment 149, wherein one or both of the first and second conductive oxide electrode layers further comprise a conducting binary oxide, wherein the one or more of SrRuO3, (La,Sr)MnO$_3$ and Nb-doped SrTiO$_3$ are interposed between the binary oxide and the ferroelectric oxide layer.
199. The semiconductor device of Embodiment 198, wherein the binary oxide is selected from the group consisting of an iridium (Ir) oxide, a ruthenium (Ru) oxide, a palladium (Pd) oxide, an osmium (Os) oxide and a rhenium (Re) oxide.
200. The semiconductor device of any one of Embodiments 152-154, wherein one or both of the first and second conductive oxide electrode layers comprise a hexagonal conductive oxide having a delafossite structure.
201. The semiconductor device of Embodiment 200, wherein the hexagonal conductive oxide having the delafossite structure includes one or more of PtCoO$_2$, PdCoO$_2$, and Al-doped ZnO.
202. The semiconductor device of Embodiments 164, wherein the barrier layer comprises one or more of Ti$_3$Al, TiAl, TiAl$_3$, NiAl, NiAl$_3$ NiAl, Ni$_2$MnGa, FeGa and Fe$_3$Ga.
203. The semiconductor device of Embodiments 165 or 166, wherein the side barrier layer comprises an oxide selected from the group consisting of MgO, TiAlO and LaAlO.
204. The semiconductor device of Embodiment 165, wherein the side barrier layer comprises one or both sidewalls of one or more of the first and second conductive oxide electrode layers and the ferroelectric oxide layer that are passivated by oxidation, fluorination and/or chlorination.
205. The semiconductor device of Embodiment 125 or the composition of matter of Embodiment 172, wherein the ferroelectric oxide layer has a chemical formula represented by $A_{(m-x)}A'_xB_{(n-y)}B'_yO_z$, wherein A and A' occupy interchangeable atomic positions in the perovskite crystal structure, wherein B and B' occupy interchangeable atomic positions in the perovskite crystal structure, wherein one or both of the A' and the B' are dopants, wherein m, n and z are integers, and wherein one or both of x and y are greater than zero.
206. The semiconductor device of Embodiment 205 or the composition of matter of Embodiment 85, wherein the dopant element is present at a concentration greater than about 12.5% on the basis of the total number of atomic sites of the metal of the ferroelectric oxide layer.
207. The semiconductor device of Embodiment 205 or the composition of matter of Embodiment 85, wherein the metal of the ferroelectric oxide layer is Bi.
208. The semiconductor device of Embodiment 205 or the composition of matter of Embodiment 85, wherein the ferroelectric oxide layer is BiFeO$_3$.
209. The semiconductor device, the capacitor or the composition of any one of Embodiments 1-120, wherein the dopant occupies an atomic lattice position that is interchangeable with a metal of the base polar material, and wherein in the polar layer, the dopant has an oxidation state that is different from the metal in the base polar material.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products. Aspects of this disclosure can be particularly implemented in various wireless telecommunication technologies in which high power, high frequency bands, improved linearity and/or improved efficiency are desired, including military and space applications such as radars, community antenna television (CATV), radar jammers and wireless telecommunication base-stations, to name a few.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure.

For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. An integrated circuit device, comprising:
a capacitor comprising a ferroelectric or paraelectric oxide having a perovskite crystal structure between first and second electrodes;
the perovskite crystal structure comprising:
corner sites occupied by at least base corner elements comprising one or both of Ba and Bi, and
center sites interchangeably occupied by one or more base center elements and one or more dopant center elements comprising at least manganese (Mn); and
a vertical diffusion barrier comprising a refractory metal or an intermetallic compound disposed over one or both of the first and second electrodes.

2. The integrated circuit device of claim 1, wherein the vertical diffusion barrier comprises one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

3. The integrated circuit device of claim 1, wherein the vertical diffusion barrier comprises one or more of $Ti_3Al$, TiAl, $TiAl_3$, $Ni_3Al$, $NiAl_3$ NiAl, $Ni_2MnGa$, FeGa and $Fe_3Ga$.

4. The integrated circuit device of claim 1, wherein the corner sites of the perovskite crystal structure are interchangeably occupied by the base corner elements and one or more dopant corner elements.

5. The integrated circuit device of claim 4, wherein the ferroelectric or paraelectric oxide has a chemical formula represented by $A_{(m-x)}A'_xB_{(n-y)}B'_yO_z$, wherein A represents the base corner elements, A' represents the dopant corner elements, B represents the base center elements and B' represents the dopant center elements, wherein m, n and z are integers, and wherein both of x and y are greater than zero.

6. The integrated circuit device of claim 5, wherein A comprises Bi.

7. The integrated circuit device of claim 5, wherein A' comprises La.

8. The integrated circuit device of claim 5, wherein B comprises Fe.

9. The integrated circuit device of claim 5, wherein B' comprises the at least Mn.

10. The integrated circuit device of claim 1, wherein one or more of the first electrode, the second electrode and the ferroelectric or paraelectric oxide has a composition gradient in a stacking direction of the capacitor.

11. An integrated circuit device, comprising:
a capacitor comprising a ferroelectric or paraelectric oxide having a perovskite crystal structure between first and second electrodes;
the perovskite crystal structure comprising:
corner sites occupied by at least base corner elements comprising one or both of Ba and Bi, and
center sites interchangeably occupied by one or more base center elements and one or more dopant center elements, wherein the dopant center elements comprise one or more selected from the group consisting of Mn, Sc, Ti, V, Cr, Co, Ni, Cu and Zn; and
a side diffusion barrier comprising a metal oxide disposed on one or more outer sidewalls of the capacitor and covering at least the ferroelectric or paraelectric oxide.

12. The integrated circuit device of claim 11, wherein the side diffusion barrier comprises a metal oxide comprising Al or Mg.

13. The integrated circuit device of claim 12, wherein the side diffusion barrier comprises an oxide selected from the group consisting of MgO, TiAlO or LaAlO.

14. The integrated circuit device of claim 11, wherein the base center elements and the dopant center elements have the same oxidation state.

15. The integrated circuit device of claim 11, wherein the dopant center elements comprise Mn.

16. The integrated circuit device of claim 11, wherein the corner sites of the perovskite crystal structure are interchangeably occupied by the base corner elements and one or more dopant corner elements.

17. The integrated circuit device of claim 16, wherein the ferroelectric or paraelectric oxide has a chemical formula represented by $A_{(m-x)}A'_xB_{(n-y)}B'_yO_3$, wherein:
A is Ba or Bi;
A' is a metal element of one of 4d series, 5d series, 4f series or 5f series;
B is Fe when the A is Bi, and Ti when the A is Ba; and
B' is the one or more selected from the group consisting of Mn, Sc, Ti, V, Cr, Co, Ni, Cu and Zn,
wherein m and n are integers, and wherein both of x and y are greater than zero.

18. The integrated circuit device of claim 11, wherein the ferroelectric or paraelectric oxide comprises a base oxide doped with the dopant center elements and dopant corner elements interchangeably occupying the corner sites, wherein the base oxide comprises one or both of $BiFeO_3$ and $BaTiO_3$.

19. The integrated circuit device of claim 18, wherein dopant corner elements comprise a lanthanide element.

20. The integrated circuit device of claim 11, wherein one or more of the first electrode, the second electrode and the ferroelectric or paraelectric oxide has a composition gradient in a stacking direction of the capacitor.

21. The integrated circuit device of claim 11, wherein the first and second electrodes are crystalline conductive oxide electrodes.

22. An integrated circuit device, comprising:
a capacitor comprising a ferroelectric or paraelectric oxide having a perovskite crystal structure between first and second electrodes;
the perovskite crystal structure comprising:
corner sites occupied by at least base corner elements comprising one or both of Ba and Bi, and
center sites interchangeably occupied by one or more base center elements and one or more dopant center elements;
a vertical diffusion barrier disposed over one or both of the first and second electrodes; and
a side diffusion barrier disposed on one or more exterior sidewalls of the capacitor and covering at least the ferroelectric or paraelectric oxide.

23. The integrated circuit device of claim 22, wherein the vertical diffusion barrier comprises a refractory metal or an intermetallic compound.

24. The integrated circuit device of claim 22, wherein the vertical diffusion barrier comprises one or more of a Ti—Al alloy, a Ni—Al alloy, a Ni—Ti alloy, a Ni—Ga alloy, a Ni—Mn—Ga alloy, a Fe—Ga alloy, a metal boride, a metal carbide, a metal nitride, Ta metal, W metal and Co metal.

25. The integrated circuit device of claim 22, wherein the side diffusion barrier comprises a metal oxide disposed on one or more exterior sidewalls of the capacitor and covering at least the ferroelectric or paraelectric oxide.

26. The integrated circuit device of claim 22, wherein the base center elements and the dopant center elements have the same oxidation state.

27. The integrated circuit device of claim 22, wherein the ferroelectric or paraelectric oxide comprises a base oxide doped with the dopant center elements and dopant corner elements interchangeably occupying the corner sites, wherein the base oxide comprises one or both of $BiFeO_3$ and $BaTiO_3$.

28. The integrated circuit device of claim 27, wherein the dopant corner elements comprise a lanthanide element.

29. The integrated circuit device of claim 22, wherein the first and second electrodes are crystalline conductive oxide electrodes.

30. The integrated circuit device of claim 22, wherein one or more of the first electrode, the second electrode and the ferroelectric or paraelectric oxide has a composition gradient in a stacking direction of the capacitor.

\* \* \* \* \*